United States Patent [19]

Forslund

[11] Patent Number: 5,659,630
[45] Date of Patent: Aug. 19, 1997

[54] ADVANCED MANUFACTURING INSPECTION SYSTEM

[75] Inventor: Donald Charles Forslund, Wappingers Falls, N.Y.

[73] Assignee: International Business Machines Corporation, Armonk, N.Y.

[21] Appl. No.: 236,008

[22] Filed: May 2, 1994

Related U.S. Application Data

[63] Continuation of Ser. No. 806,942, Dec. 11, 1991, abandoned.

[51] Int. Cl.$^6$ .............................. G06K 9/56; G06K 9/64
[52] U.S. Cl. ..................... 382/149; 382/304; 348/129
[58] Field of Search ........................ 382/1, 8, 55, 41, 382/49, 147, 149, 304; 356/237; 348/126, 129, 130

[56] References Cited

U.S. PATENT DOCUMENTS

| | | | |
|---|---|---|---|
| 3,106,698 | 10/1963 | Unger | 382/304 |
| 3,706,071 | 12/1972 | Gray | 382/218 |
| 3,959,777 | 5/1976 | Kimmel | 395/581 |

(List continued on next page.)

OTHER PUBLICATIONS

Baxes, *Digital Image: Processing: Principles and Applications,* John Wiley & Sons, Inc. 1994. pp. 60–62, 439.

"High Frequency Data Rate Transformer." *IBM Technical Disclosure Bulletin,* vol. 29, No. 3, Aug. 1986, pp. 1159–1161.

M.J. Kimmel, Mite: Morphic Image Transform Engine an Architecture for Reconfigurable Pipelines of Neighborhood Processors, Nov. 1985, pp.493–500.

Lo–Soun Su, Thomas E. Wohr and James L. Leybourne, Automatic Pattern Inspection for Multilayer Ceramic Package, pp. 616–622.

Haruo Yoda et al., An Automatic Wafer Inspection System Using Pipelined Image Processing Techniques, Jan. 1988, pp. 4–16.

Ahmed M. Darwish and Anil K. Jain, A Rule Based Approach for Visual Pattern Inspection, Jan. 1988, pp. 56–78.

Yasuhiko Hara, Hideaki Doi et al., A System for PCB Automated Inspection Using Fluorescent Light, Jan. 1988, pp. 69–78.

Azriel Rosenfeld, Cellular Architectures From Automata To Hardware, Computer Vision Lab., 1982, pp. 253–288.

ASCI for Image Processing, IEEE Transaction on Pattern Analysis and Machine Intelligence, Jan. 1988, pp. 111–117.

(List continued on next page.)

*Primary Examiner*—Michael T. Razavi
*Attorney, Agent, or Firm*—Whitham, Curtis, Whitham & McGinn; Tiffany Townsend

[57] ABSTRACT

An advanced manufacturing inspection system includes a database containing a rasterized reference image of the product inspected at the inspection resolution, allowing for accurate representation of shaped features. The full image is stored in the system database and is accessed and fed in a raster manner to an electronic registration subsystem which aligns the reference data to the incoming thresholded product inspection data. The aligned reference and inspection data are driven to all parallel defect detection channels. A classifier block selects the output of the desired channels for recording into a defect memory. Alternatively, the thresholding of the inspection gray scale signal is done after registration such that thresholding can be controlled by the reference data. The system is flexible in rendering abnormalities between reference and gray scale inspection images and functions independently of image resolution because the reference and inspection images are of the same resolution. The defects to be rendered are dependent upon that specified by the product designers and the process engineers. Each defect type to be found and rendered is processed by a separate channel whose output can be selected for entry into the defect memory.

4 Claims, 23 Drawing Sheets

U.S. PATENT DOCUMENTS

| | | | |
|---|---|---|---|
| 4,001,787 | 1/1977 | Kimmel | 326/35 |
| 4,003,024 | 1/1977 | Riganati et al. | 382/302 |
| 4,011,547 | 3/1977 | Kimmel | 395/250 |
| 4,056,716 | 11/1977 | Baxter et al. | 382/148 |
| 4,065,212 | 12/1977 | Belleson et al. | 356/398 |
| 4,167,728 | 9/1979 | Sternberg | 382/303 |
| 4,174,514 | 11/1979 | Sternberg | 382/303 |
| 4,197,584 | 4/1980 | Blazek | 364/551.01 |
| 4,215,401 | 7/1980 | Holsztynski et al. | 382/304 |
| 4,301,443 | 11/1981 | Sternberg et al. | 382/257 |
| 4,322,716 | 3/1982 | Sternberg | 382/303 |
| 4,369,430 | 1/1983 | Sternberg | 382/205 |
| 4,395,697 | 7/1983 | Dargel et al. | 382/303 |
| 4,395,698 | 7/1983 | Sternberg et al. | 382/308 |
| 4,395,699 | 7/1983 | Sternberg | 382/257 |
| 4,395,700 | 7/1983 | McCubbrey et al. | 382/303 |
| 4,398,176 | 8/1983 | Dargel et al. | 382/303 |
| 4,414,685 | 11/1983 | Sternberg | 382/257 |
| 4,441,207 | 4/1984 | Loughheed et al. | 382/144 |
| 4,442,543 | 4/1984 | Sternberg et al. | 382/257 |
| 4,464,788 | 8/1984 | Sternberg et al. | 382/276 |
| 4,464,789 | 8/1984 | Sternberg | 382/291 |
| 4,477,926 | 10/1984 | Linger et al. | 382/8 |
| 4,484,346 | 11/1984 | Sternberg et al. | 382/303 |
| 4,484,349 | 11/1984 | McCubbrey | 382/308 |
| 4,510,616 | 4/1985 | Lougheed et al. | 382/144 |
| 4,524,455 | 6/1985 | Holsztynski et al. | 382/303 |
| 4,541,116 | 9/1985 | Lougheed | 382/303 |
| 4,574,394 | 3/1986 | Holsztynski et al. | 382/303 |
| 4,590,607 | 5/1986 | Kauth | 382/294 |
| 4,654,583 | 3/1987 | Ninomiya et al. | 356/394 |
| 4,675,730 | 6/1987 | Adomaitis et al. | 348/131 |
| 4,752,897 | 6/1988 | Zoeller et al. | 382/141 |
| 4,817,175 | 3/1989 | Teuenbaum et al. | 382/304 |
| 4,881,269 | 11/1989 | Billiotte et al. | 382/8 |
| 4,949,390 | 8/1990 | Iverson et al. | 382/49 |
| 5,055,997 | 10/1991 | Sluijter et al. | 382/41 |
| 5,119,434 | 6/1992 | Bishop et al. | 382/55 |
| 5,175,824 | 12/1992 | Soderbery et al. | 395/325 |
| 5,230,027 | 7/1993 | Kikuchi | 382/41 |
| 5,253,306 | 10/1993 | Nishio | 382/199 |

OTHER PUBLICATIONS

Stanley R. Sternberg, Pipeline Architectures For Image Processing, Academic Press, Inc., 1982, pp. 291–305.

D. C. Forslund, Void And Island False Call Limiter, IBM Technical Disclosure Bulletin, Oct. 1990, pp. 286–288.

Bjorn Kruse "Aparallel Picture Processing Machine", IE2 Trans on Comp. Volc–22, No. 12, Dec. 1973.

Mandeville, "Novel Method for Automated Optical Inspection of Printed Circuits", IBM Research Report RC 9000, Mar. 17, 1983.

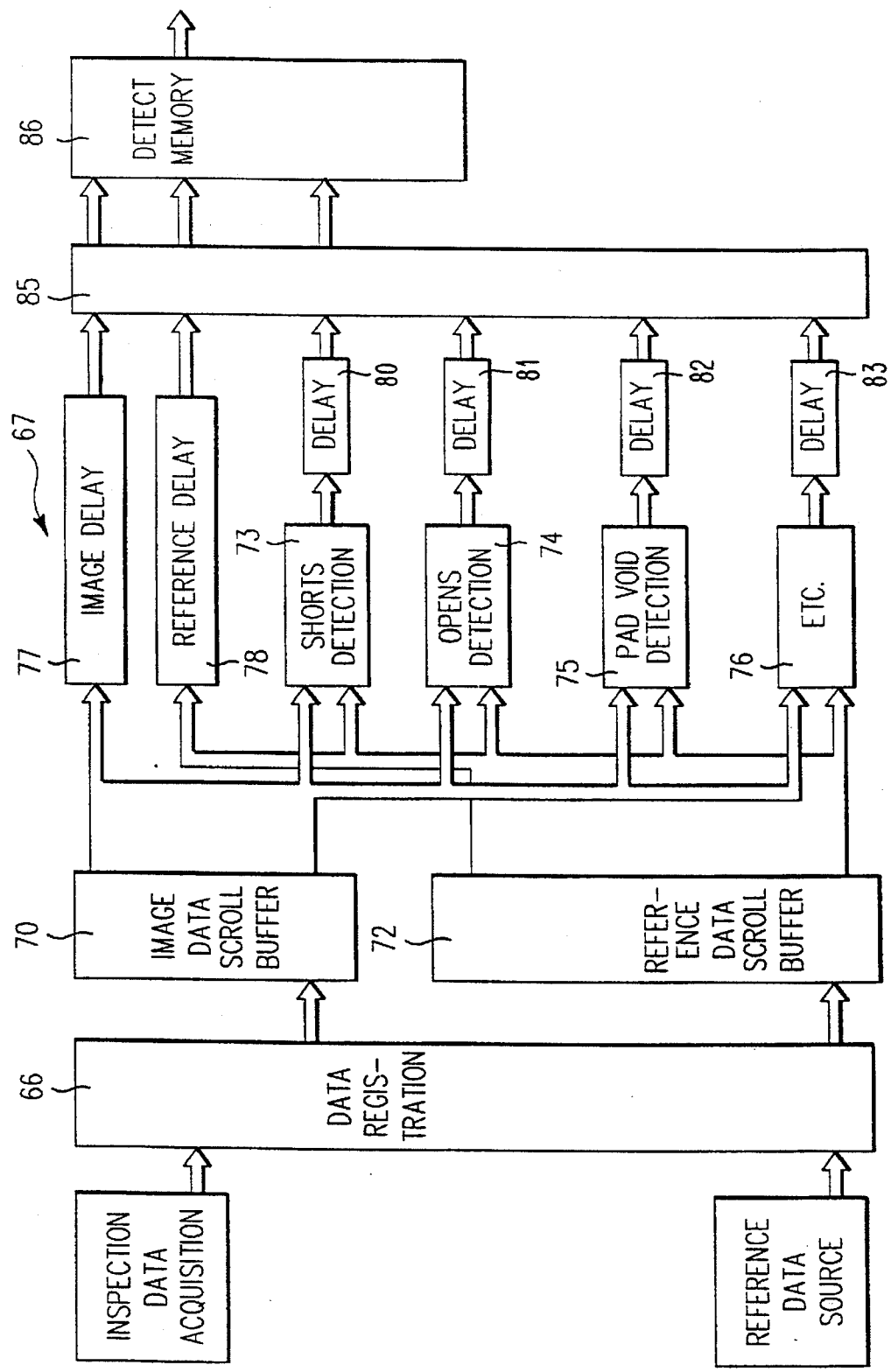

FIG.17A
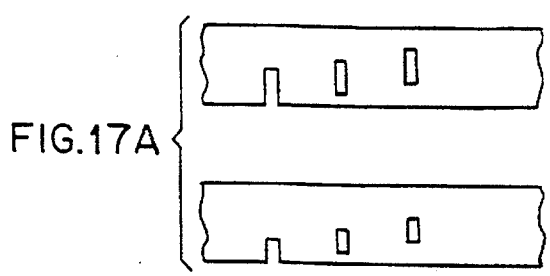
FIG.17B
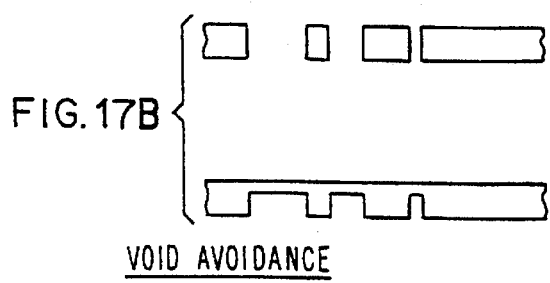
VOID AVOIDANCE
FIG.17C
FIG.17D
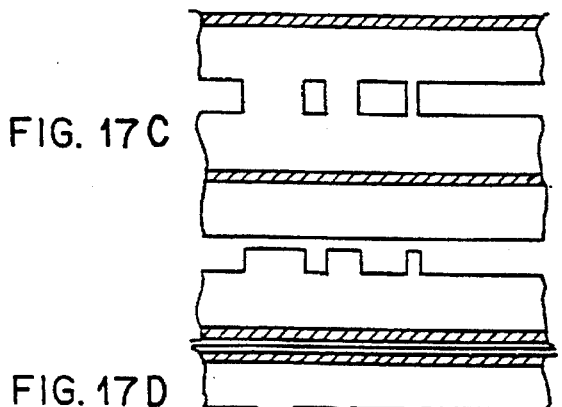
FIG.17E
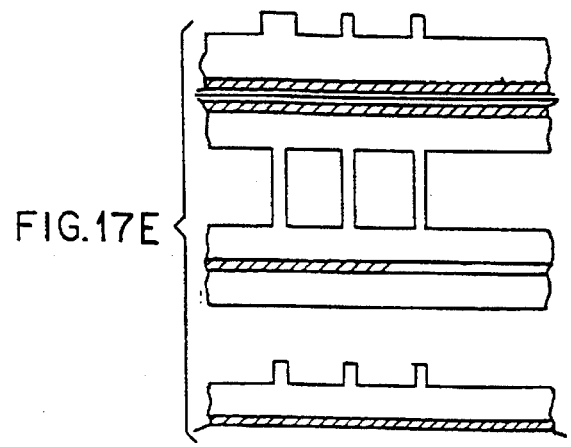
FIG.17F
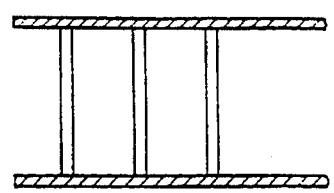
FIG.17G
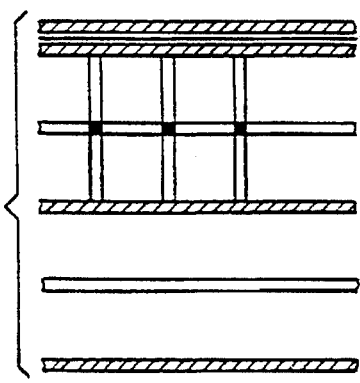
FIG.17H
FIG.17I
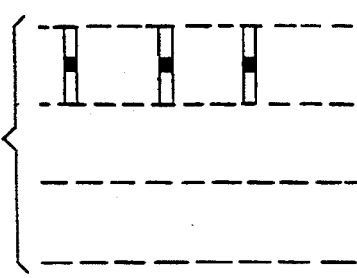
FIG.17J
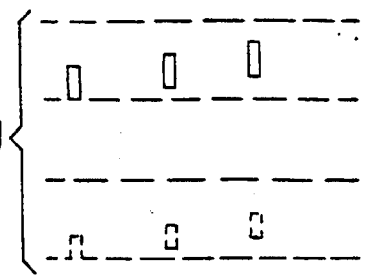

NO DEFECT

DEFECT

ADVANCED MANUFACTURING INSPECTION SYSTEM

This application is a continuation of application Ser. No. 07/806,942, filed Dec. 11, 1991 now abandoned.

CROSS-REFERENCE TO RELATED APPLICATIONS

The subject invention is related to the inventions disclosed in co-pending patent application Ser. No. 07/806,944 filed concurrently herewith by Donald C. Forslund and Mark A. Casparian for "Electronic Parallel Raster Dual Image Registration Device" (IBM Docket FI9-89-058) and Ser. No. 07/758,155 filed Sep. 12, 1991, by Donald C. Forslund and H. Muenster for "Universal Image Processing Module" (IBM Docket FI9-88-030). The disclosures of application Ser. No. 07/806,944 and Ser. No. 07/758,155 are incorporated herein by reference.

DESCRIPTION

BACKGROUND OF THE INVENTION

1. Field of the Invention

The present invention generally relates to a high speed inspection system for manufacturing processes and, more particularly, to an inspection system capable of assuring the integrity of precision manufactured products. The invention has particular application to the inspection of parts, such as printed circuit boards (PCBs) or cards and the like.

2. Description of the Prior Art

The architectures of inspection machines fundamentally are separated into three categories: design rule types, reference based types and a combination of design rule and reference based types.

The design rule type operates on the converted optical image alone making measurements according to the rules of design of the part being inspected. Such design rules include minimum conductor line and space widths and are applied within the context of the inspection image.

The reference based type operates on both the converted optical image and some form of a stored ideal image. It is necessary to have both images in registration for the operation. The reference image either is compared with the inspection image or controls the processing of it.

Real-time processing of images requires sufficient processing power in the form of hardware that is distributed such that the images are simply operated on upon arrival at the first stage and the partial image results are passed on to the next stage of processing. The amount of image processing accomplished is dependent upon the pipeline length of the cascaded processing stages.

An image processor can be described as non-pipeline if the same processor operates successively upon the original and resulting images to completion. Such processors include two-dimensional array processors, parallel sets of one-dimensional image microprocessors and relatively simple template matching and measurement operations.

One type of reference based inspection system processes the image to form a list of discovered features. Those features may be a segment of a conductor, a conductor end, a conductor bend, etc. The reference image may be similarly processed to form a similar list. The two lists are then compared. There are two forms of feature generation and comparison. The first is the kind where the reference image is registered with the image and the features of both images are compared immediately upon generation. The second is the kind where the reference image is once converted into features and those features are registered and compared each time with the inspection features generated from the image.

Template matching describes a type of operation in reference based and design rule systems. In the design rule system, a fixed two-dimensional template is used to measure the minimum feature size, such as a conductor. Additional processing of the results are required to render the defect. In reference based processing, the template can be a fixed minimum size template, such as a conductor bend, invoked by the reference image to be compared with the image. It could also be a direct comparison with a minimum form of the reference image.

Morphological processing involves successive modifications of inspection and reference images for the purpose of extracting significant topological information. It is more involved than template matching in that a multiple of image transformations are required in order to extract the information. Yet, the extents of image solutions are limited only by the creativity of the morphological processing designer or programmer.

SUMMARY OF THE INVENTION

It is therefore an object of the present invention to provide a manufacturing inspection system that is at least equal to the part handling speed of prior art systems while doubling the resolution.

It is another object of the invention to provide an intimate reference based inspection system but with reference resolution equal to that of the inspection image.

It is yet another object of the invention to provide an inspection system employing morphological image processing which is fifty times faster than comparable systems and allowing parameter programming for specific manufacturing requirements.

According to the invention, there is provided an advanced manufacturing inspection system which includes a database containing a rasterized reference image of the product inspected at the inspection resolution. This allows for accurate representation of shaped features. The full image is stored in the system database and is accessed and fed in a raster manner to an electronic registration subsystem which aligns the reference data to the incoming thresholded product inspection data. Registration of reference images to the optical image for the subject invention is discussed in copending patent application Ser. No. 07/806,944 (IBM Docket FI9-89-058) which discloses the registration of two raster generated images. The aligned reference and inspection data are driven to all the parallel defect detection channels. A classifier block selects the output of the desired channels for recording into the defect memory.

In an alternative embodiment, the thresholding of the inspection gray scale signal is done after registration such that thresholding can be controlled by the reference data. Several versions of thresholded data are thus available as binary inspection data to several defect detection channels. Likewise, several levels of aligned reference images are available to the channels for other useful purposes.

The invention provides a system that is flexible in rendering abnormalities between reference and gray scale inspection images. The system functions independently of image resolution because the reference and inspection images are of the same resolution. The defects to be rendered are dependent upon that specified by the product designers and the process engineers. Thus, each defect type to be found and rendered is processed by a separate channel whose output can be selected for entry into the defect memory. In this manner, several different product types or parts may be inspected with differing specifications. Each channel is created by cable plugging together connections to standard channel boards containing standard high speed morphological image processing devices and programming the multifunctional devices. Improvements to this channel approach are directed toward software programmable interconnection between these devices and boards to provide at least one channel for engineering algorithm development purposes.

BRIEF DESCRIPTION OF THE DRAWINGS

The foregoing and other objects, aspects and advantages will be better understood from the following detailed description of a preferred embodiment of the invention with reference to the drawings, in which:

FIG. 9 is a block diagram showing in more detail the separate channels of the inspection system according to the invention;

FIGS. 17A to 17J are a sequence of images which render a large "mouse bite" and voids but ignore a small "mouse bite" and voids in a land pattern;

DETAILED DESCRIPTION OF PREFERRED EMBODIMENTS OF THE INVENTION

Specific Examples of the Prior Art

Figure 1:
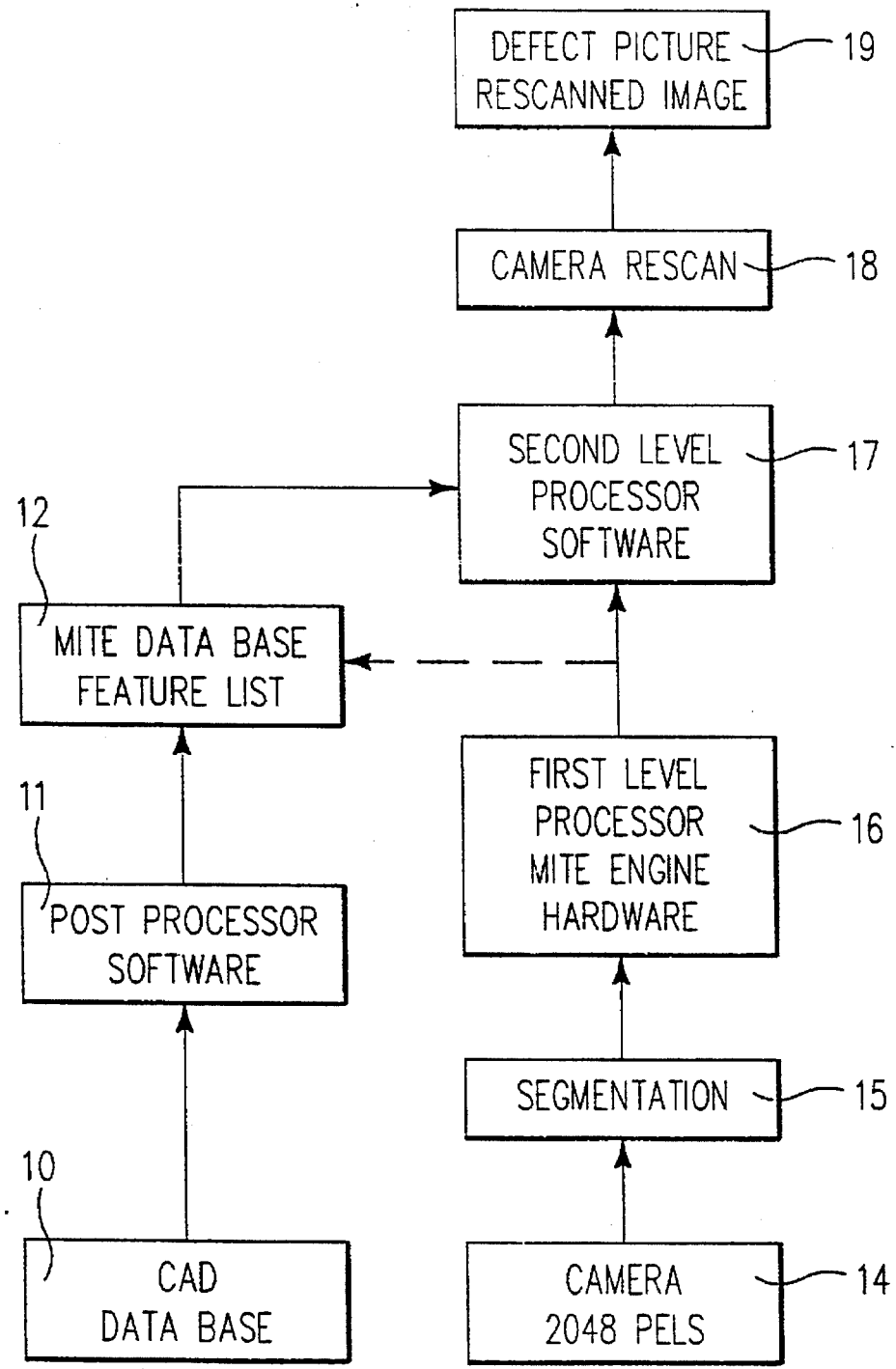
FIG. 1 is a block diagram showing the MITE inspection system.

As background to the description of the subject invention, several specific examples of prior art inspection systems are first described and illustrated. These are illustrated in FIGS. 1 to 5. Referring first to FIG. 1, there is shown in block diagram form the MITE inspection system. The MITE system is a morphological processing system that produces a list of image features which are compared with a preprocessed list of reference image features. The feature lists are registered.

More specifically, the product data is retrieved from a database 10 and subject to post processor software 11 to generate a reference feature list which is stored in the MITE database 12. The part being inspected by the system is scanned by camera 14, and the image data stream is subject to segmentation by segmentation function 15. A first level hardware processor 16 described by M. J. Kimmel, R. S. Jaffe, J. R. Mandeville, and M. A. Lavin in "MITE: Morphic Image Transform Engine, An Architecture for Reconfigurable Pipelines of Neighborhood Processors", *IEEE Computer Society CAPAIDM*, Nov. 18–20, 1985, processes the segmented image data stream. The outputs of the feature list from the MITE database 12 and the first level processor 16 are input to a second level processor 17 implemented in software. The second level processor 17 makes a comparison of the feature list from the database 12 with the processed segmented data stream from the first level processor 16 and, upon detecting defects, generates a camera rescan output 18 that directs the camera 14 to rescan the product in the area of detected defects. The result is a display 19 of defects.

The ORBOT system, manufactured by ORBOT SYSTEMS LTD., Yavne, Israel, is a two-level processor providing conductor width measurements and a listing of image features which are compared with a preprocessed list reference image features. As in the MITE inspection system, the feature lists are registered. The ORBOT system is similar to the MITE system and comprises a database from which reference image features are retrieved. The output is subject to a post processor to create a feature list which is stored in a database. The part being inspected by the system is scanned by a camera, and the image data stream is subject to segmentation. A first level processor processes the segmented image data stream and stores the results. The outputs of the feature list from the ORBOT database and the first level processor are input to a second level processor. The second level processor makes a comparison of the feature list from the database with the processed segmented data stream and, upon detecting defects, generates a camera rescan output that directs the camera to rescan the product in the area of detected defects. The result is a display of defects. This display is then viewed by a human operator who makes a judgement on the defects detected and displayed.

The AGIS system is described by L-S. Su, T. E. Wohr and J. J. Leybourne in "Automatic Pattern Inspection for Multilayer Ceramic Package", *IEEE* 0569-5503/89/0616. This system is a two-level processor which registers and templates the image and reference image in the first level to identify potential defects or flaws and processes those flaws in a second level processor to identify the real defects.

Figure 2:
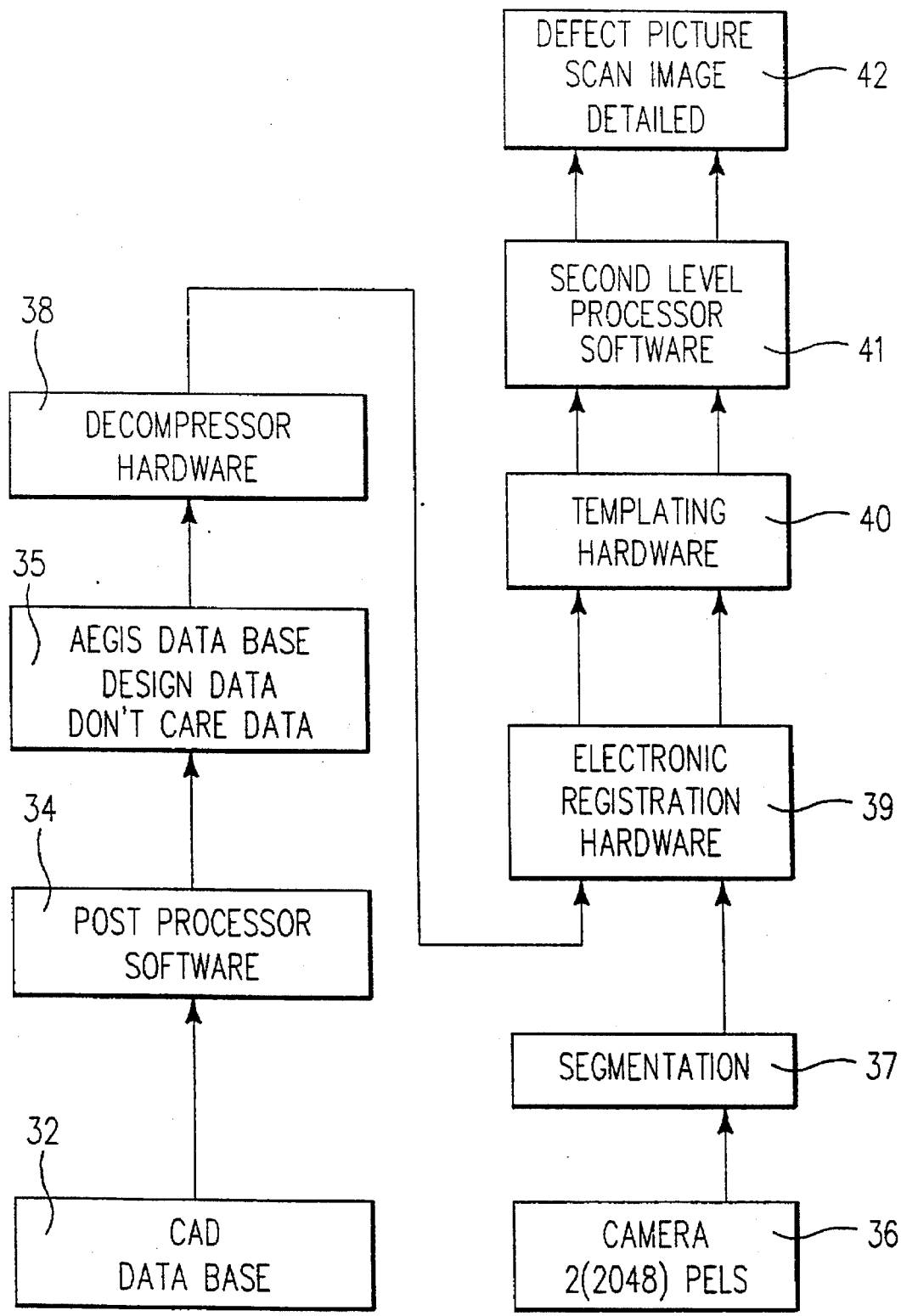
FIG. 2 is a block diagram showing the AGIS inspection system.

As shown in FIG. 2, the AGIS system comprises a database 32 from which reference image features are retrieved. The full image data is generated by post processor software 34 together with adjunct "care-don't-care" image data. This data is compressed and stored in the AGIS database 35. The part being inspected by the system is scanned by camera 36, and the image data stream is subject to segmentation by segmentation function 37. The data in the AGIS database 35 is decompressed by decompressor hardware 38 and supplied with the segmented image data stream from segmentation function 37 to electronic registration hardware 39. The registered data streams from the electronic registration hardware 39 are input to templating hardware 40. A second level processor 41 implemented in software makes a comparison of the templated data streams and displays defects in display 42.

Figure 3:
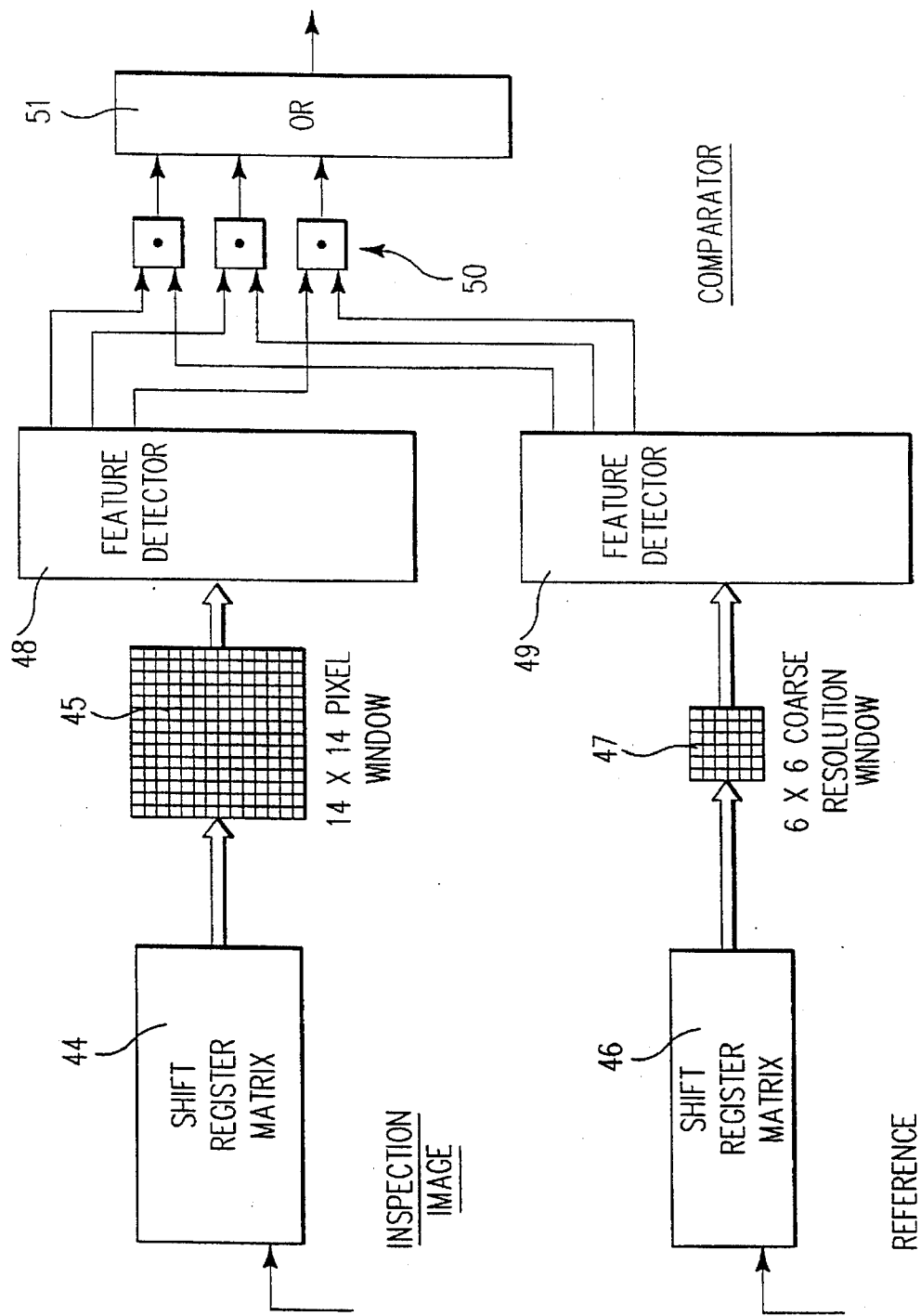
FIG. 3 is a block diagram showing another known inspection system.
Figure 4:
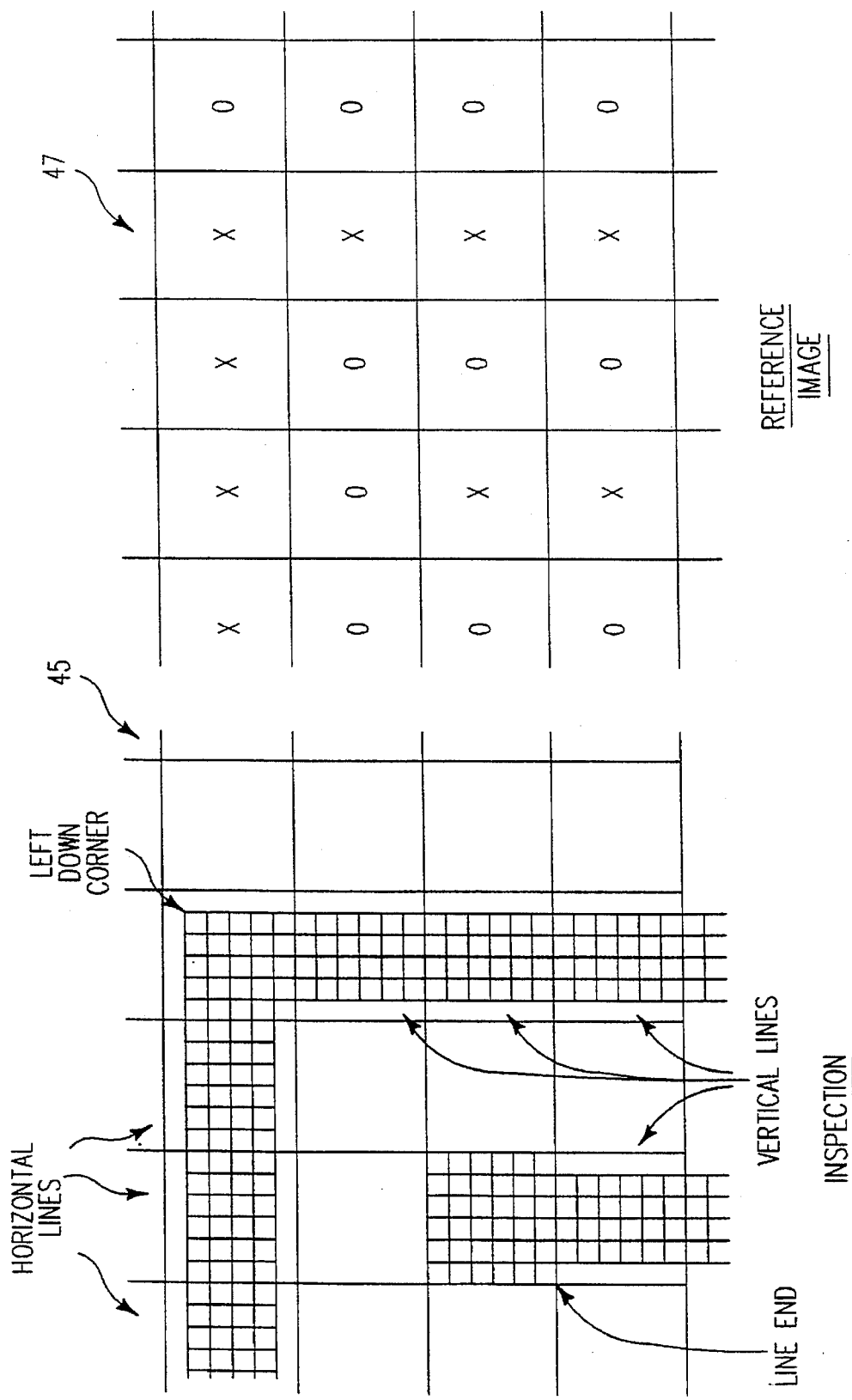
FIGS. 4A and 4B are enlarged views of the inspection and reference image windows in the inspection system shown in FIG. 3.

U.S. Pat. No. 4,056,716 to Baxter et al. disclose the feature generation and comparison scheme which is depicted in FIG. 3. In FIG. 3, a fine resolution inspection image contained in shift register 44 is output as a 14×14 pixel window 45 which is registered to a coarse resolution reference image contained in shift register 46 and output as a 6×6 pixel window 47. FIGS. 4A and 4B respectively show enlarged views of the windows 45 and 47. Each image is applied to respective fixed wired combinatorial logic template sets 48 and 49 which provide logic lines for each of the available templated features. The coarse and fine resolution features from template sets 48 and 49 are first ANDed in AND gates 50, and the outputs of AND gates 49 are ORed on OR gates 51 to provide the assertion that the desired feature was found. This system, because of the templating, operates on a fixed grid of a fixed set of features. The reference and inspection images are registered by mechanical means.

The Baxter et al. system is limited to a set of fixed features inspectable and the fixed pitch grid upon which these features must be found. The limitations of the MITE inspection system are the slow speed of image processing (5 Mhz) and its post feature reference comparison method which lacks the full power of intimate reference base processing. The limitations of the AGIS system are the "care-don't-care" templating algorithm which requires finer than necessary resolution and the slow flaw processor. The limitations of the ORBOT system are the limited design rule measurements available and the post feature reference comparison method.

Description of the Invention

Figure 5:
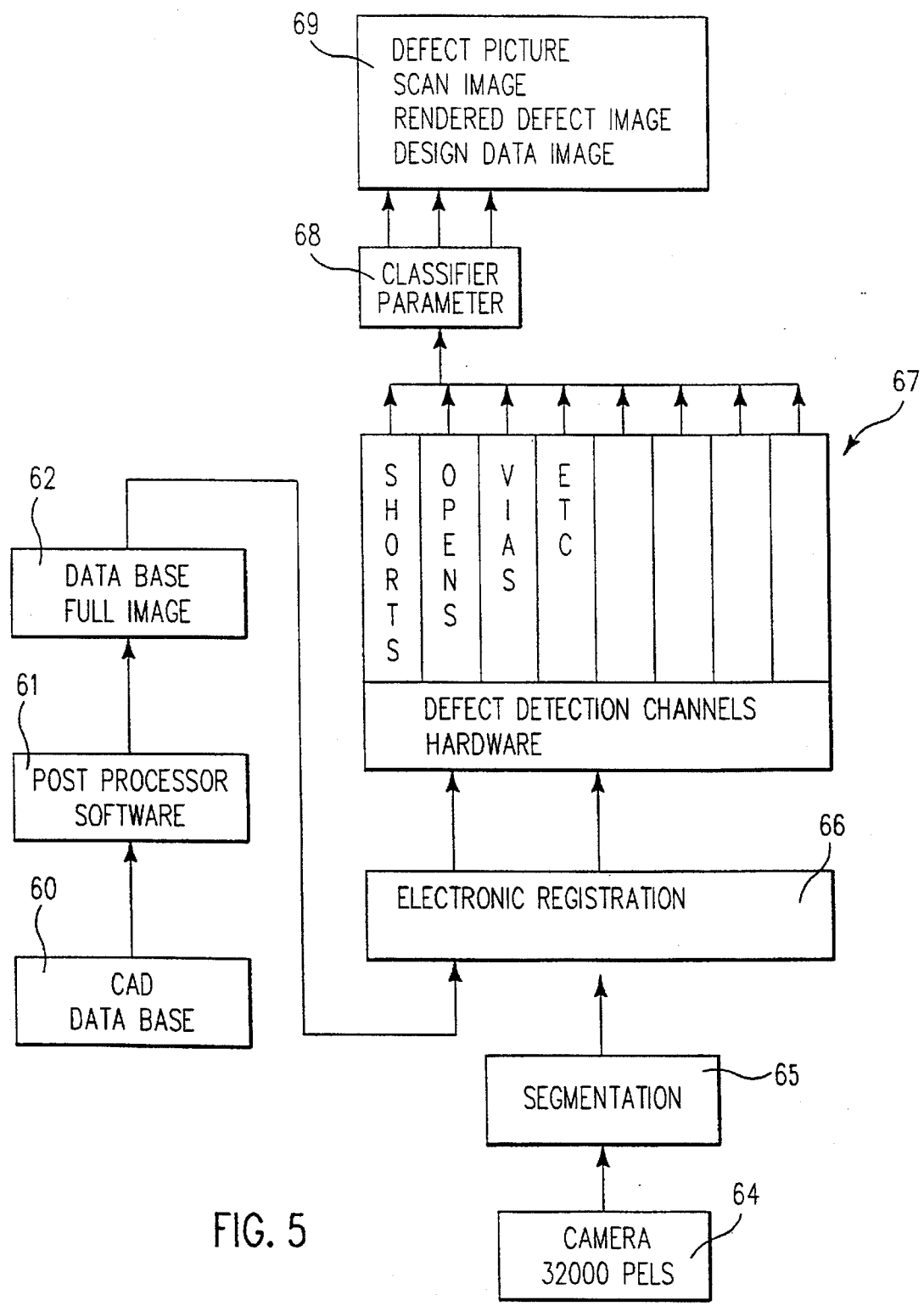
FIG. 5 is a block diagram of a first embodiment of the inspection system according to the invention.

Referring now to FIG. 5, there is shown a block diagram of the advanced manufacturing inspection system according to a first preferred embodiment of the invention. In FIG. 5, a product design database 60 contains the product computer aided design (CAD) data. This data is processed in postprocessor 61, implemented in software, to produce a rasterized reference image of the product at the inspection resolution. The full image is stored in the system database 62 in compressed form. Compression of the data is preferably performed as described by D. C. Forslund and A. S. Ganoung in "Data Compression Method", *IBM Technical Disclosure Bulletin*, vol. 30, no. 11, April 1988, pp. 133–138. This rasterized image is accessed from the database 62 and fed in a raster manner to an electronic registration subsystem 66.

A camera 64, such as a laser scanner, vidicon or charge coupled device (CCD), generates a rasterized image data stream which is applied to segmentation circuitry 65. The segmentation circuitry 65 produces a thresholded image data stream which is output to the electronic registration system 66. The electronic registration system 66 aligns the reference data from the system database 62 to the incoming thresholded product inspection data from segmentation circuitry 65. Registration of reference images to the inspection image for the subject invention is discussed in copending patent application Ser. No. 07/806,944 (IBM Docket FI9-89-058) which discloses the registration of two raster generated images.

The aligned reference and inspection data from the electronic registration system 66 are driven to all the parallel defect detection channels 67. A classifier block 68 selects the output of the desired channels for recording into the defect memory 69.

Figure 6:
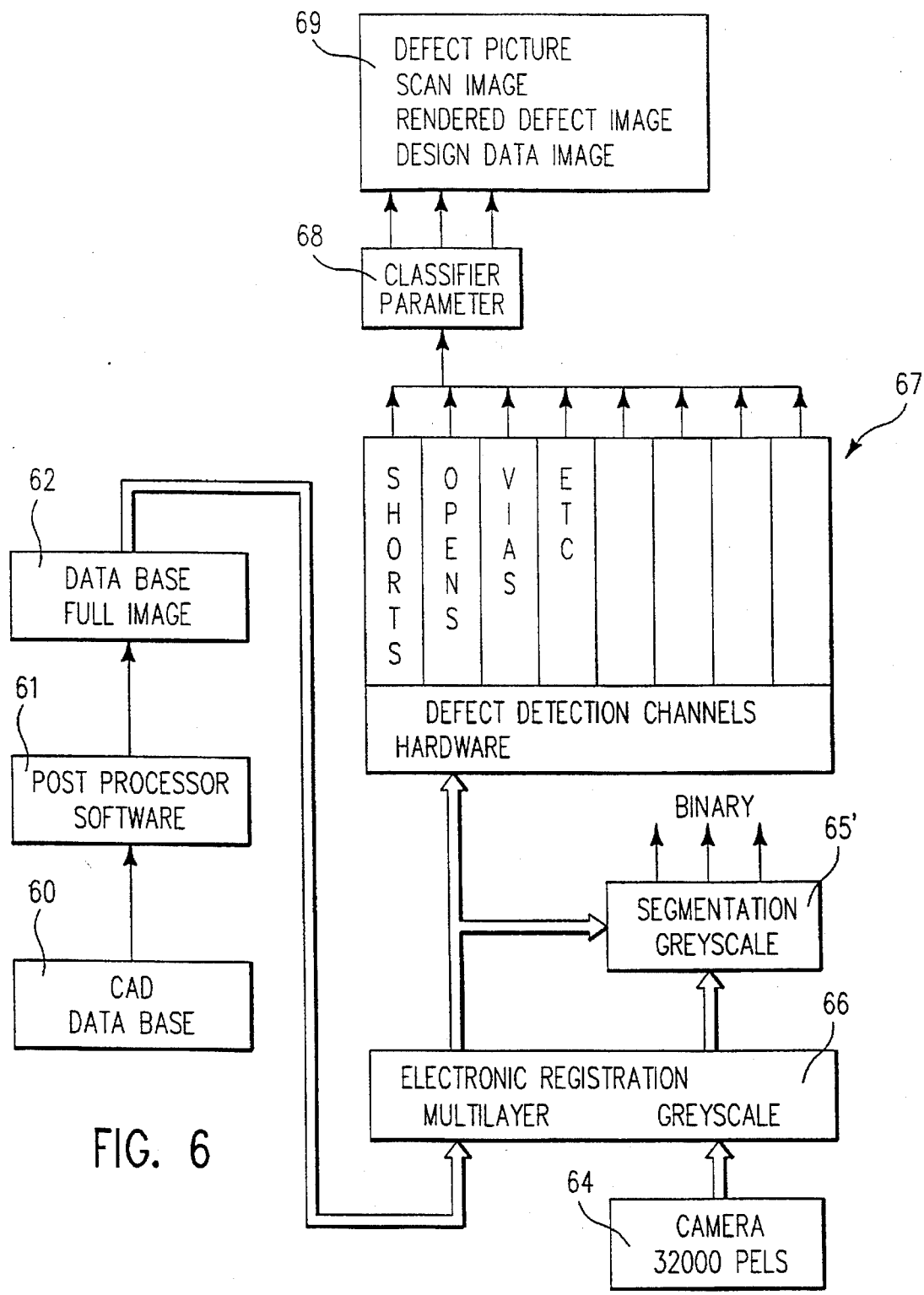
FIG. 6 is a block diagram of a second embodiment of the inspection system according to the invention.

In an alternative embodiment shown in FIG. 6, the rasterized inspection image from camera 64 is fed directly to the electronic registration system 66. The registered reference image signal is then used by the segmentation circuitry 65' for thresholding of the inspection image gray scale signal. Several versions of thresholded data are thus available as binary inspection data to several defect detection channels 67. Likewise, several levels of aligned reference images are available to the channels for other useful purposes.

In this invention, speed of inspection is obtained by processing multiple adjacent image rasters simultaneously. The preferred embodiment advances the image at sixteen rasters, although any raster size advance is possible.

Figure 7A:
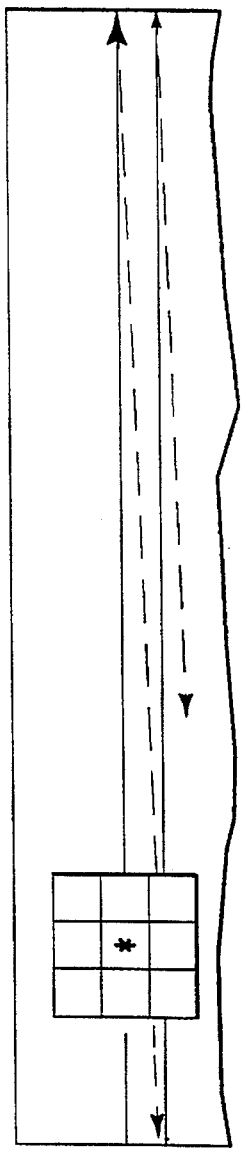
FIGS. 7A, 7B, 7C, and 7D illustrate the differences in raster processing parallelism.

FIGS. 7A, 7B, 7C, and 7D illustrate the difference in methods of increasing the overall image processing speed of images acquired or presented in a raster manner. The 3×3 pixel array centered on the pixel marked with the asterisk ("*") depicts the neighborhood of pixels in the image field surrounding the marked pixel. In FIG. 7A, a single neighborhood is scanned across the image field in a raster manner computing the results to be entered into a subsequent field (not shown). It is assumed that cascaded neighborhood processors are required to form the desired image processing algorithm. If the rate at which the image is presented to the processors is higher than what the processors are capable of handling, the image must be partitioned such that smaller pieces are presented at a slower rate in parallel to a multiple of cascaded processors.

Figure 7B:
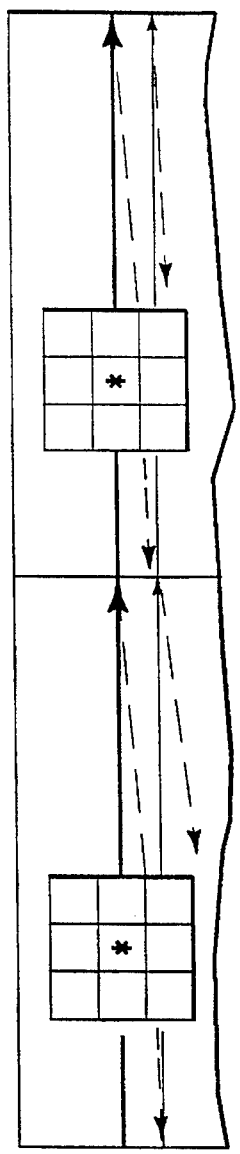

FIG. 7B illustrates that the image is sectioned into two halves and two sets of processors operate sequentially upon their respective halves. Although not shown, there is a need for a scheme for sharing the image at the dual section boundary (referred to as "overlap") by the two processors. Excessive application of this kind of parallelism will meet with diminishing returns as the resulting decreasing scan length approaches the required fixed algorithm overlap length. See, for example, the multiple image segment processing disclosed in U.S. Pat. No. 4,174,514 to Sternberg and No. 4,484,349 to McCubbrey and in any two-dimensional array processing and further discussed by S. R. Sternberg in "Pipeline Architectures for Image Processing",

*Multicomputers and Image Processing Algorithms and Programs*, Academic Press (1982), pp. 291–305.

Figure 7C:
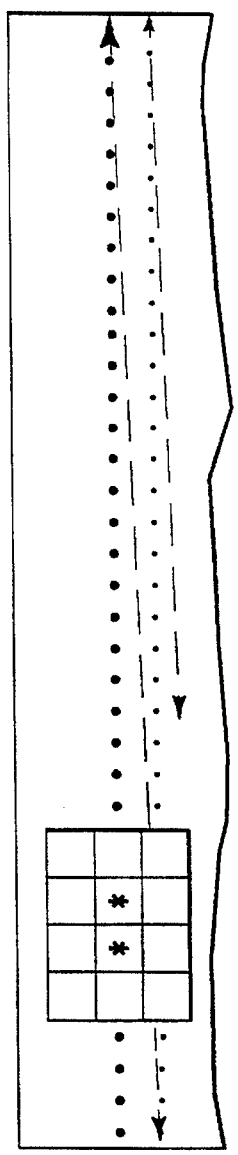

FIG. 7C illustrates the parallel combining of two neighborhood processors with their neighborhoods in a manner that computes the desired results of two adjacent pixels in the same raster. Pixel pairs arrive and leave the parallel processor pair at half the clocking rate of the original image rate. The raster is advanced by one for each full image scan. This technique employing triplets is employed in the machine disclosed in the aforementioned U.S. Pat. No. 4,056,716 to Baxter et al.

Figure 7D:
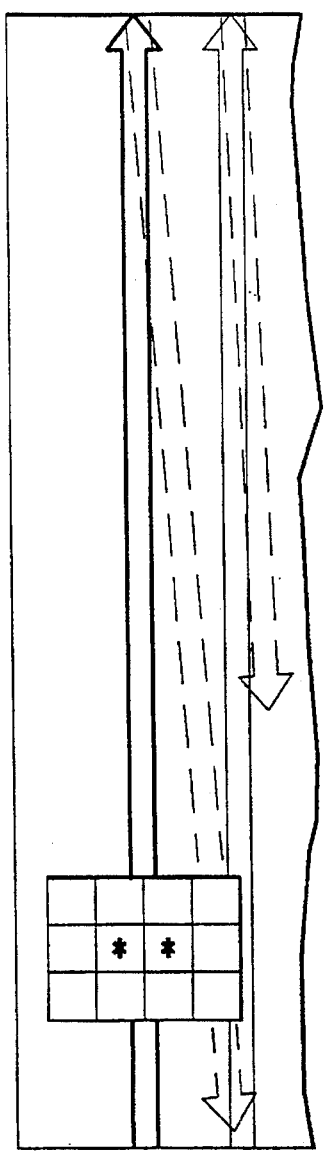

FIG. 7D illustrates the method employed in this invention. The processors are parallel combined in a manner that computes the desired results of vertically contiguous adjacent pixels simultaneously during the full image scan. This technique does not suffer the problem of diminishing returns of parallelism because no new boundary overlap computations are required. Additional parallelism can be attained by abutting additional processors and advancing the image raster stream by the amount of parallelism employed. The production of sixteen simultaneous rasters are described by M. A. Casparian and D. C. Forslund in "High Frequency Data Rate Transformer", *IBM Technical Disclosure Bulletin*, vol. 29, no. 3, August 1986, pp. 1159–1161. This means of multiple raster image processing is different from the approach described by S. R. Sternberg, supra.

Referring back to FIGS. 5 and 6, the inspection data, gray scale or binary, moves through the registration system 66 unchanged, while the frames of the reference data are selected to best match the inspection data. This allows fidelity of the unknown inspection image to the defect detection channels 67.

As inspection image data arrives sixteen rasters at a time into the electronic registration system 66, sixteen rasters of aligned reference and inspection data leave. These aligned sets of rasters are stored in scrolling stacks which are sufficiently deep enough to contain the largest image feature to be analyzed.

Figure 8A:
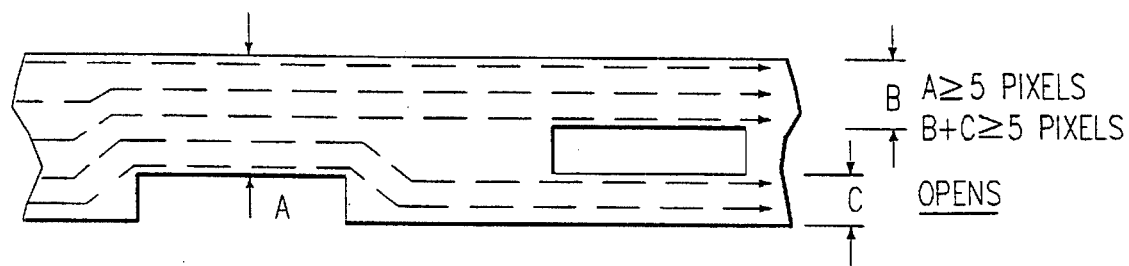
FIGS. 8A, 8B and 8C are illustrations of three defect types detected in separate channels of the inspection system shown in FIGS. 5 and 6.
Figure 8B:
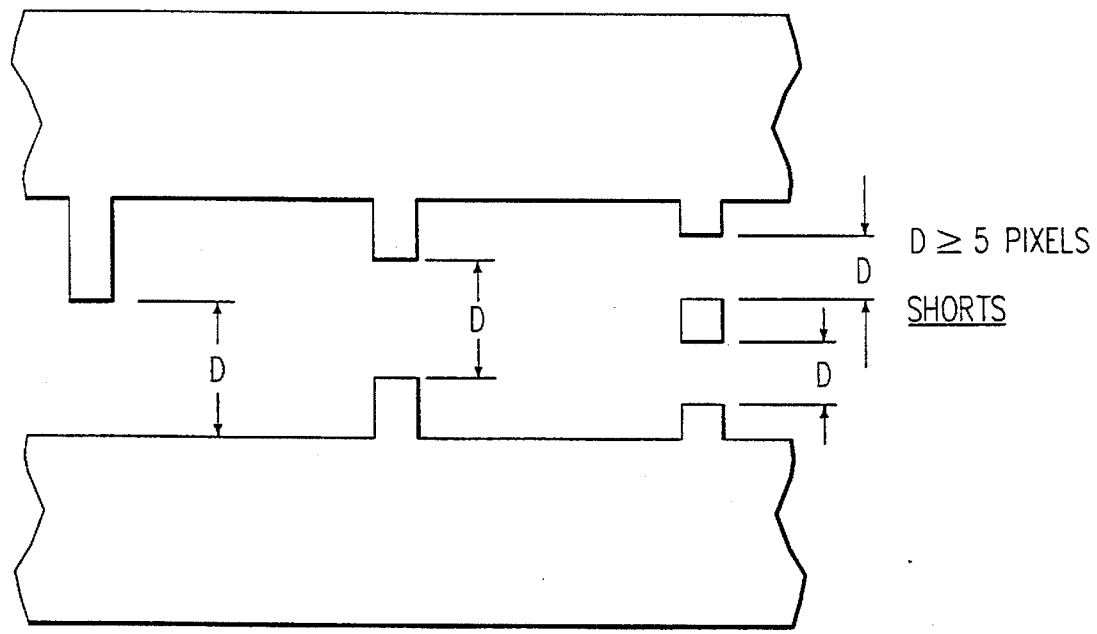
Figure 8C:
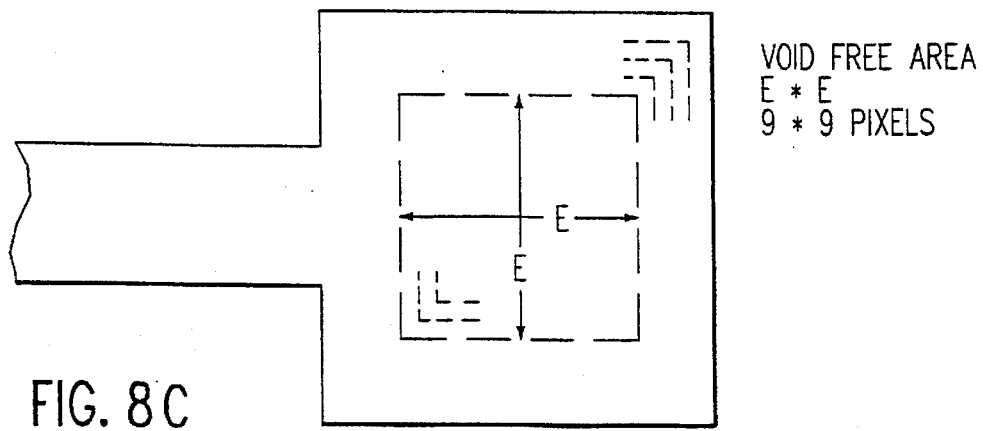

An inspection system generally provides means for finding several forms of defects typical of a type of product. In order to demonstrate the versatility of this kind of high speed system, several examples of printed circuit inspection requirements are illustrated in FIGS. 8A, 8B and 8C. FIG. 8A illustrates the requirements for minimum conductor pattern width, FIG. 8B illustrates the requirements for minimum spacing between land patterns, and FIG. 8C illustrates the requirements for a minimum void free contact area at the land termination points. These are but three examples, and any given product might require other defect detections.

The minimum conductor width example shown in FIG. 8A requires that electric current flow through constrictions not less than five pixels. Dimensions A and the sum of B plus C must be five pixels or more.

The minimum spacing between land patterns is shown in FIG. 8B as dimension D which, in this example, is also five pixels. Potentially shorting islands between lands must also be separated by five pixels.

In FIG. 8C, contacts, for bonding purposes, must be an area of E×E or, in the example illustrated, 9×9 pixels which is void free. That area can be found in any location within four pixels of nominal reference center.

Circuits providing rendition of defects of these examples are described below.

Defect Detection Channels

FIG. 9 illustrates that each of the defect types is detected in separate channel pipelines. More specifically, inspection image and reference image data is provided to the electronic registration system 66 which provides registered inspection image and reference image data to respective data scroll buffers 70 and 72. The inspection and reference image scrolling buffers 70 and 72 provide wide raster swathes of advancing image data to each of the defect detection channels. In the example illustrated, these defect detection channels include a shorts defect detection channel 73, an opens defect detection channel 74, a pad void defect detection channel 75, and such other defect detection channels 76 as may be required for a particular inspection system. In addition, the inspection and reference image scrolling buffers 70 and 72 provide the same advancing rasterized image data to respective image and reference delays 77 and 78.

The two streams of inspection and reference images travel through morphological operators in the defect detection channels, and an image of the defect exits from each channel. Because each channel has a different morphological length, appropriate delays 80 to 83 are also respectively provided at the outputs of the defect detection channels 73 to 76 to maintain system synchronization. The inspection and reference images, together with the defect images from each of the defect detection channels 73 to 76 therefore arrive coincidentally at switch 85 for recording in the defect memory 86.

The common morphological component used in the defect detection channels is the universal image module (UIM) which is the subject of copending application Ser. No. 07/758,155 (IBM Docket FI9-88-030). The UIM is a four stage, twenty-four raster wide switchable integrated circuit (IC) capable of accepting as many as three image inputs and providing as many as two outputs. When operated as a skeletal operator, it provides two neighborhood operations; otherwise, it provides four simple neighborhood operations.

Each UIM includes a plurality of paired sections identified as a front or upstream section and rear or downstream section. The upstream section receives image data bits from a data source which may be another UIM. The upstream and the downstream section can each selectively perform one of a plurality of morphological functions including image thinning, image shrinking, image expansion, image contraction, edge detection, image trimming, partial image summation and other functions. The upstream section can perform, in addition, a class of Boolean functions and a special function for changing pixels on a 45° angle to the direction of image scanning. The downstream section, in addition, can perform a delay function. A plurality of UIMs are typically configured in an array to process image pixels according to a programmable sequence of functions to be performed on the image. Further information on the UIMs may be obtained by reference to application Ser. No. 07/758, 155 (IBM Docket FI9-88-030).

Figure 10:
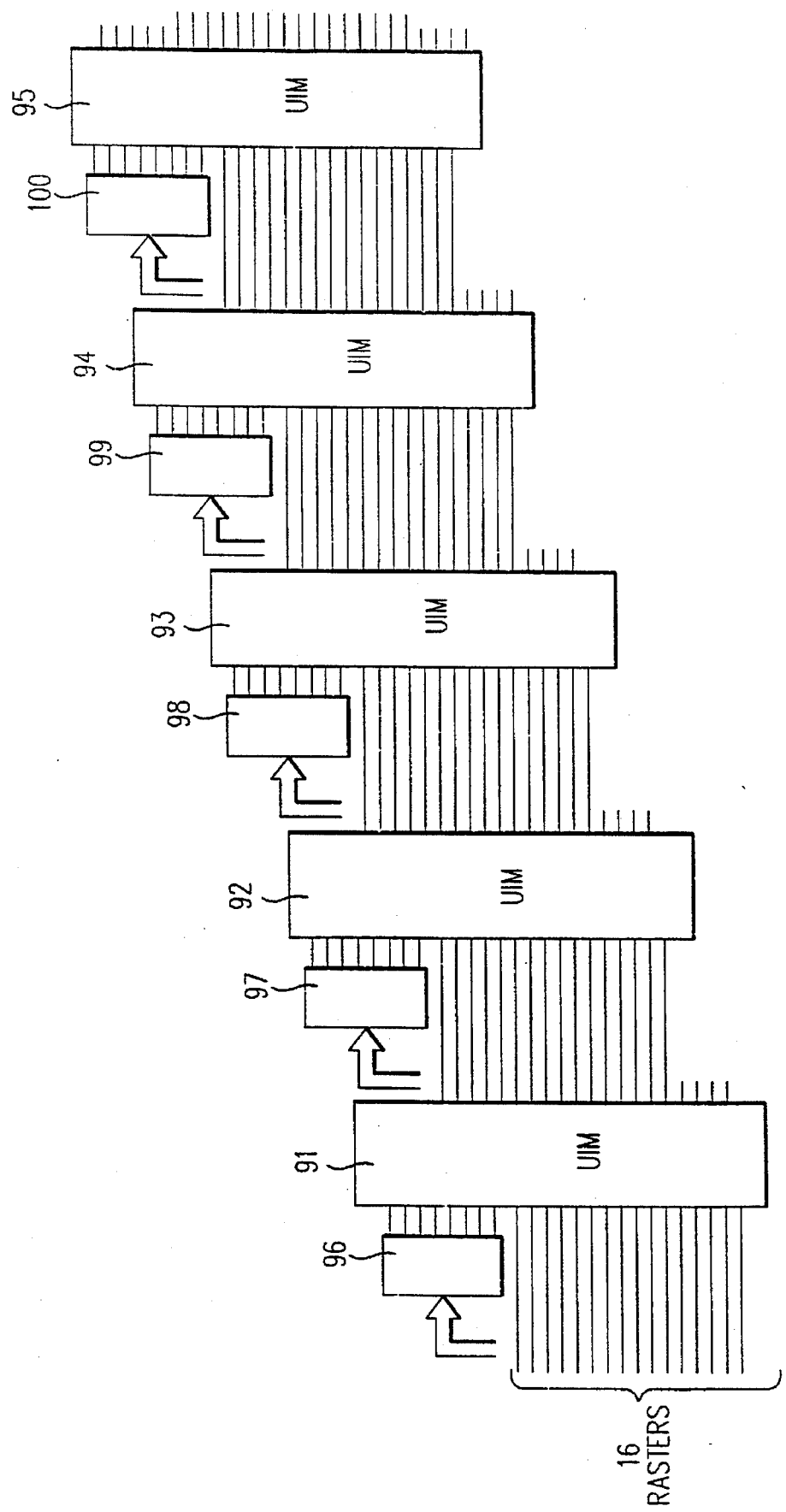
FIG. 10 is a block diagram showing a cascaded pipeline of universal image modules (UIMs) used in the defect detection channels.

FIG. 10 illustrates how one sixteen raster advancing image is applied to a cascaded pipeline of five UIMs 91 to 95. Because a single 3×3 neighborhood process produces a single output at each stage, each stage requires two more inputs for each output. Therefore, each four stage UIM requires eight more inputs than outputs. The bottom eight rasters of a sixteen raster image are delayed by eight raster delay lines, each block of eight raster delay lines being represented by blocks 96 to 100, to provide the upper rasters of a twenty-four raster input to the UIM, which produces a centered sixteen raster output transformed image. This is one method of connecting UIMs.

Figure 11:
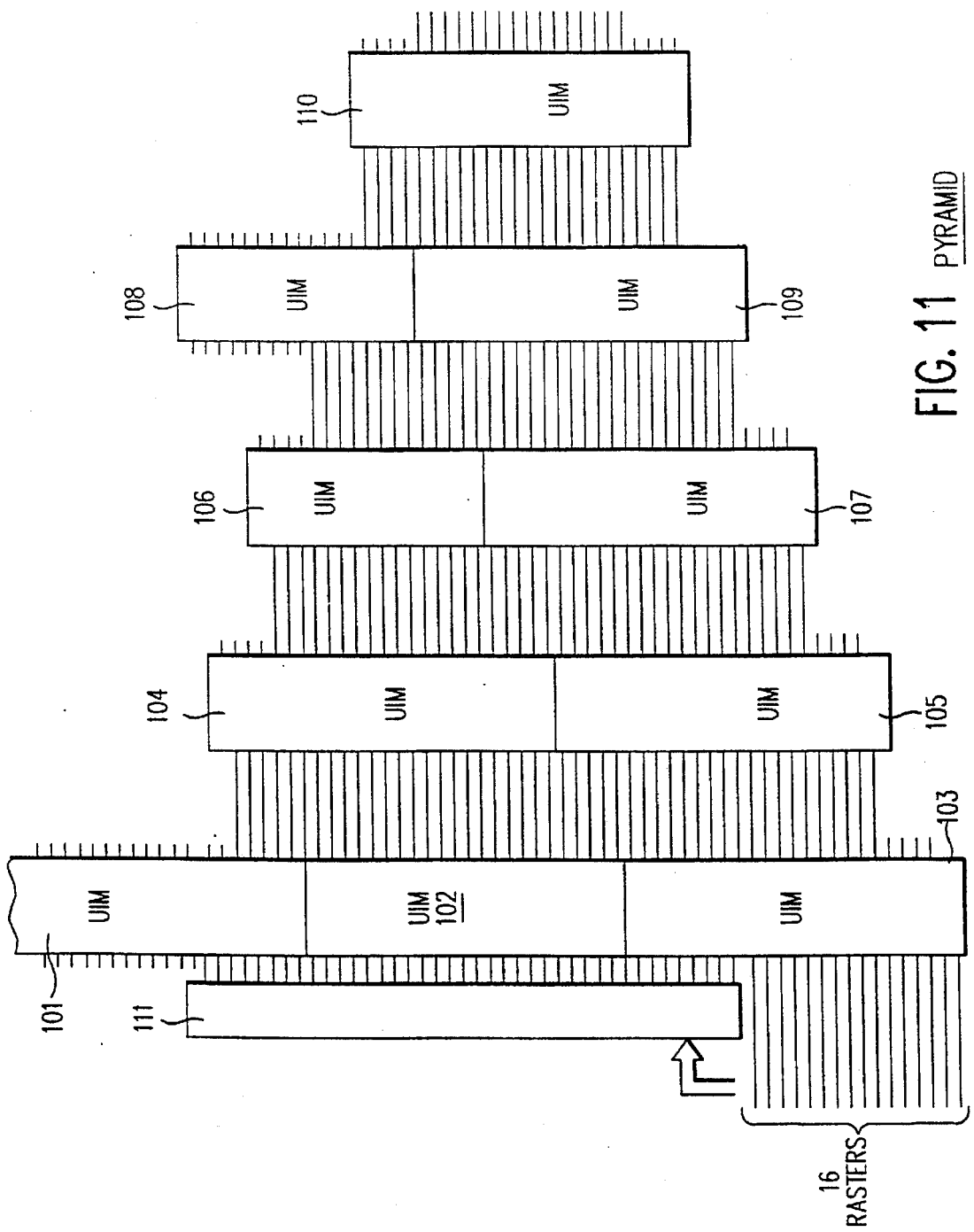
FIG. 11 is a block diagram showing a pyramid connection of UIMs used in the defect detection channels.

The second method of UIM connection, called the pyramid mode, is illustrated in FIG. 11. Ten UIMs 101 to 110 can be stitched in vertical combinations such that the eight raster image delay lines required for each of the UIMs connected in cascade as shown in FIG. 11 can be either eliminated or placed up stream. The resulting block of forty raster image delay lines 111 is placed upstream of the vertical stack of UIMs 101, 102 and 103. When placed upstream in this manner, the delay lines become redundant with the inspection and reference scrolling buffers in FIG. 9 and can be totally eliminated.

Both methods of connection are concurrently possible within the channels. Despite the UIM being connected in a sixteen raster mode as shown in FIG. 10 or in a pyramid mode as shown in FIG. 11, it is possible to express the morphological defect detection algorithm in a more simple form. This channel implementation approach does not necessarily limit itself to employing the UIMs solely. Other circuits optimally implementing templating, measurement, and similar functions can be employed within the channels either in the UIM ASIC footprint or other compatible mode.

Shorts Detection

Figure 12:
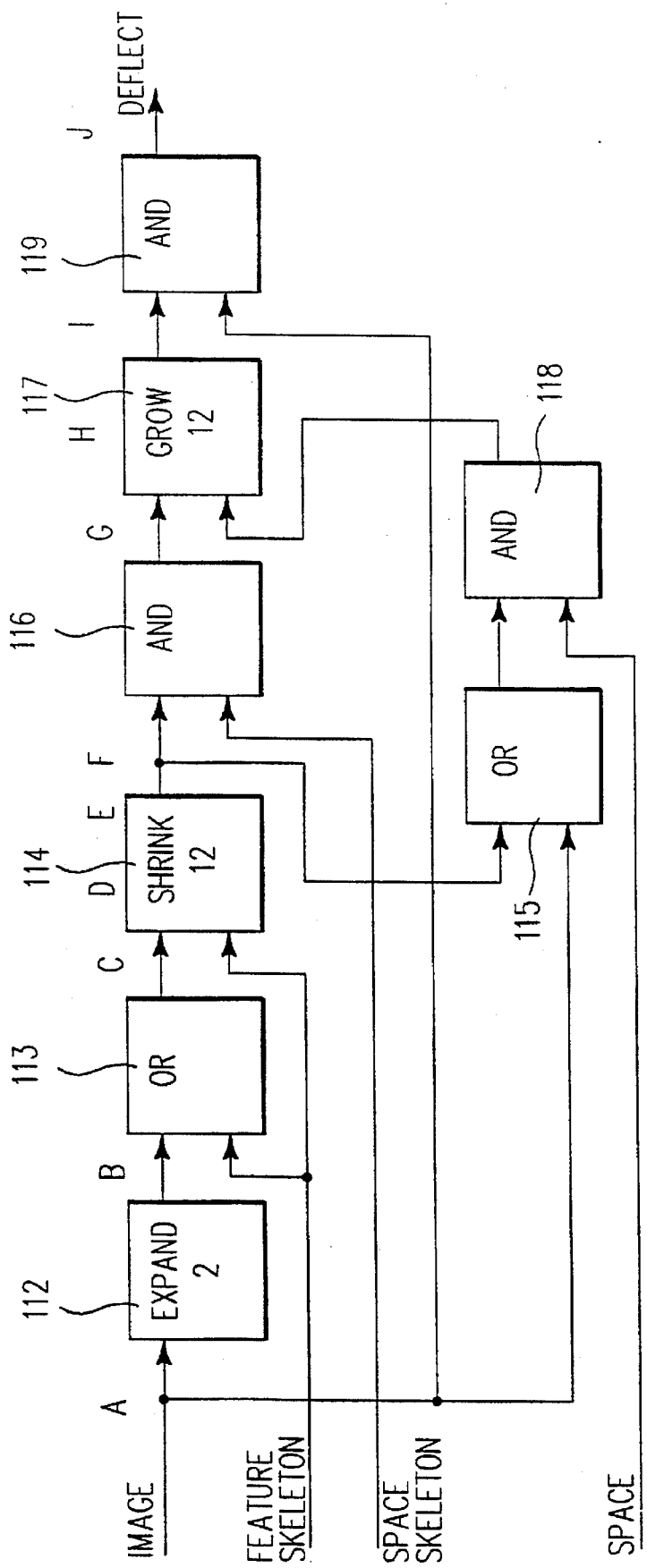
FIG. 12 is a block diagram the shorting detection circuit according to a preferred embodiment of the invention.

An example of the more simple form is shown in FIG. 12 which illustrates a circuit that renders shorting defects. In FIG. 12, delays are not shown. The input image may be sixteen rasters wide or wider, but it is shown as a single input to logic block 112 which provides an expansion of the image. The number of expansions in the example is two. The doubly expanded image is then ORed with a feature skeleton by OR gates 113. The outputs of the OR gates 113 are input to logic block 114 where the image is shrunk twelve times. Logic block 114 also receives the feature skeleton and provides outputs to OR gates 115 and AND gates 116. The feature skeleton and the space skeleton have been previously produced either through morphic processing of the incoming reference image or as an adjunct stored image aligned with the reference image.

AND gates 116 also receive as inputs the space skeleton and provide outputs to logic block 117. OR gates 115 also receive as inputs the image and provide outputs to AND gates 118. AND gates 118 also receive the space inputs and provide outputs to logic block 117. Logic block 117 grows the resulting image by twelve times and provides outputs to AND gates 119, which also receive as inputs the image. The outputs of the AND gates 119 are an image of the detected defect.

Each of the blocks 112, 114 and 117 are composed of UIMs. The UIM containing four stages of simple functions and two stages of skeletal functions is used in multiples or distributed over the circuit as needed in either the raster delay or pyramid modes of FIGS. 10 or 11.

Figure 13A:
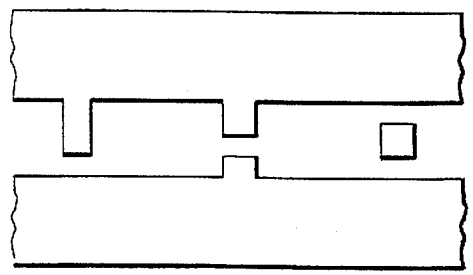
FIGS. 13A to 13J are a sequence of images at several points in the circuit of FIG. 12 which renders a shorting defect.
Figure 13B:
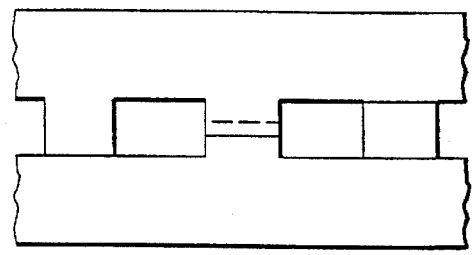
Figure 13C:
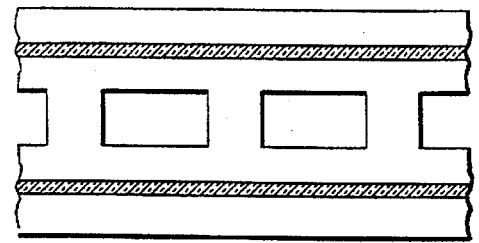
Figure 13D:
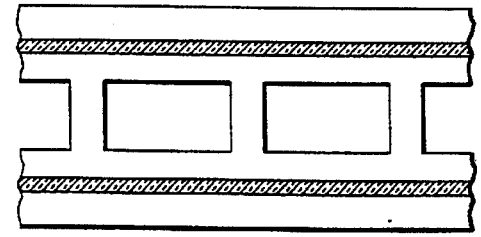
Figure 13E:
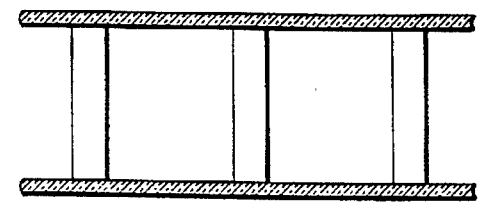

FIGS. 13A to 13J show a sequence of images at several points in the circuit of FIG. 12 which renders a shorting defect. The circled letters in FIG. 12 identify the place in the circuit where the corresponding image of FIGS. 13A to 13J is formed. The input image contains two land patterns with near shorts similar to that in FIG. 8B. The double expansion of the image in FIG. 13A causes the near shorting projections to merge as in the image of FIG. 13B. The image of FIG. 13C is shrunk in several stages, forming the images shown in FIGS. 13D, 13E and 13F.

Figure 13F:
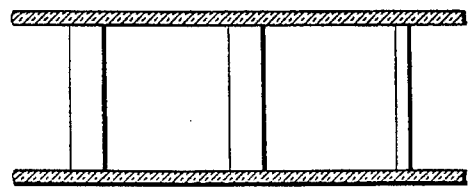
Figure 13G:
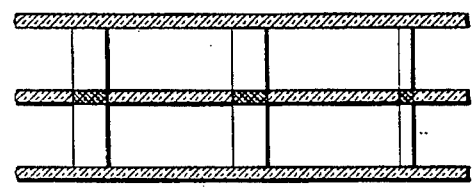
Figure 13H:
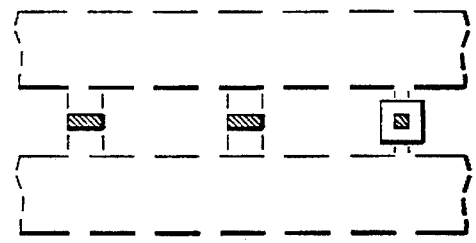
Figure 13I:
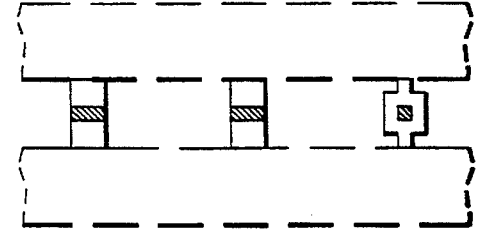
Figure 13J:
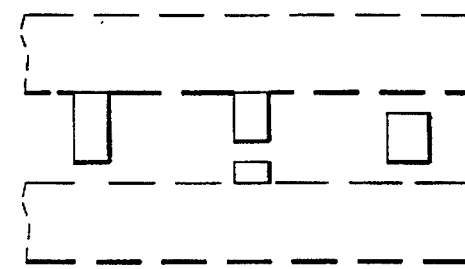

The reference feature skeleton is continually ORed in OR gates 113 during the shrinking process such that the shorts do not disappear due to missing conductor portions (i.e., opens). The image of FIG. 13F is ANDed in AND gates 116 with the reference space skeleton, which is generated in another circuit, to form the intersection image shown in FIG. 13G. This image contains only the centers of the defect (referred to herein as the "seed"). A non-short would have been shrunk away from the middle of the space region and not formed a seed. In a parallel operation, the shrunk image shown in FIG. 13F is ORed in OR gates 115 with the inspection image of FIG. 13A to provide a conductor connection between near shorts. That image is not shown but is similar to the image shown in FIG. 13A and is used as a constraining image during the growing process of the seed which produces the images shown in FIGS. 13H and 13I. To remove the conductor connection between the near shorts, the inspection image shown in FIG. 13A is ANDed in AND gates 119 with the image shown in FIG. 14I to form the image shown in FIG. 13J, which is the rendered shorting defects.

Figure 14:
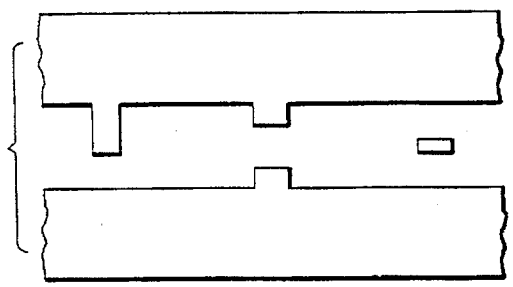
FIGS. 14A to 14J are a sequence of images at several points in the circuit of FIG. 12 wherein no shorting defect is rendered.
Figure 14:
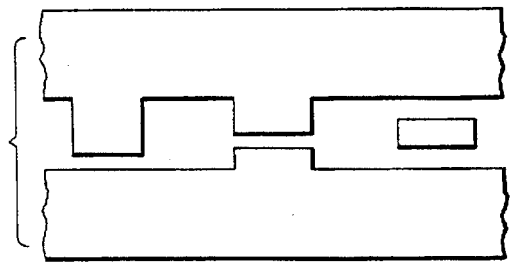
Figure 14:
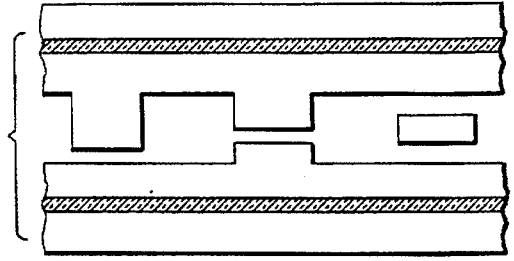
Figure 14:
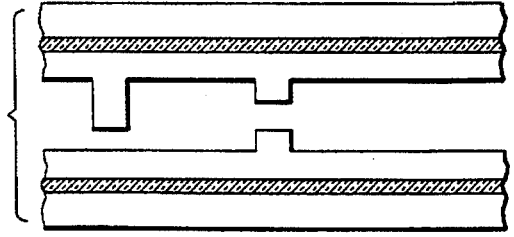
Figure 14:
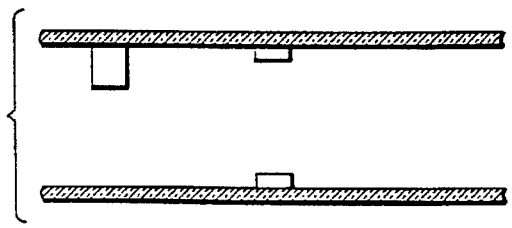
Figure 14:
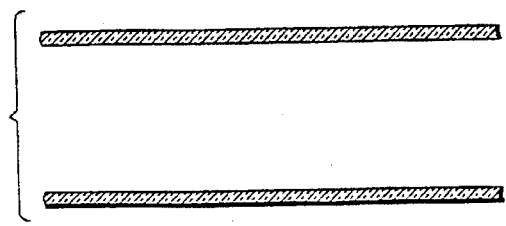
Figure 14:
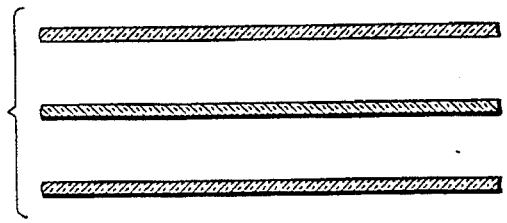
Figure 14:
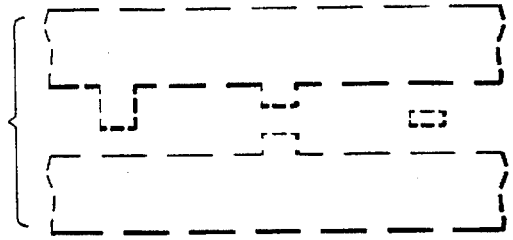
Figure 14:
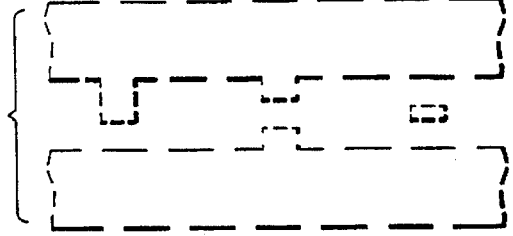
Figure 14:
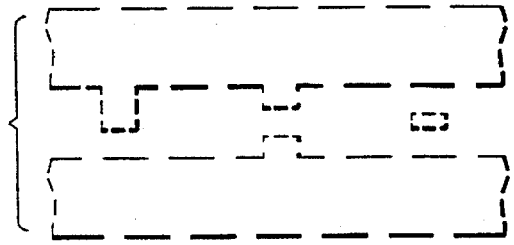

Had the near shorts been within the specified tolerance as shown in FIG. 14A, the images produced throughout the circuit would be as follows. The image of FIG. 14B produced at the output of logic block 112 would have no merging. The feature skeleton would still be ORed in OR gates 113 to generate the image shown in FIG. 14C. Shrinking through the images shown in FIGS. 14D, 14E and 14F would eliminate all protrusions from one land pattern to the other. The ANDing in AND gates 116 of the space skeleton would not form any defect centers (seeds). Since there would be no centers of defects, no defects would be grown for rendition in the images shown in FIGS. 14H, 14I and 14J.

Opens Detection

Figure 15:
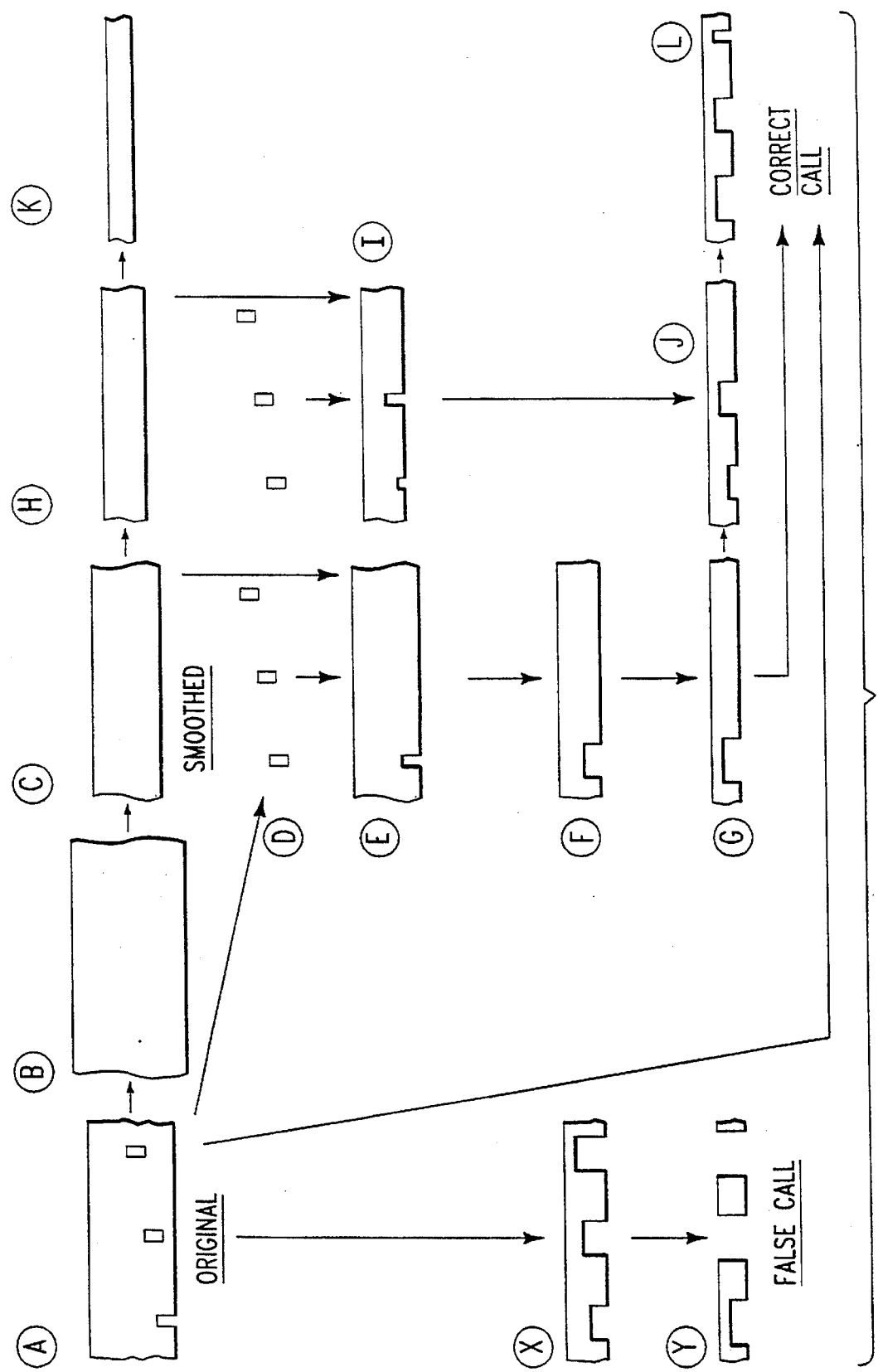
FIG. 15 illustrates a land pattern image and several morphological modifications resulting in no open defect being correctly detected.

FIG. 15 illustrates a land pattern image and several morphological modifications of it. The original land pattern at A has two voids and a "mouse bite", the latter being a void at the edge of the land pattern. This conductor is satisfactory to conduct current according to the specifications of FIG. 9A. Two contractions of the conductor image should not extinguish the image. However, when the original image A is simply contracted once, the image shown at X is formed, and when contracted again, the image shown at Y is formed. Parts of the conductor image are extinguished indicating false opens or near opens. This situation is caused by the contraction process upon the voids. Basically, one void will double the contraction rate, and two orthogonally positioned voids will triple the contraction rate.

This problem is overcome by eliminating the voids from the conductor image and reintroducing them when they are adjacent to the space after each successive contraction; i.e., when they become "mouse bites". The process of generating the images B through L produces an image that is representative of the true pixel cross-section of the conductor image. The original image A is expanded to form image B which is contracted to form image C which is the void-free version of the original image A.

The inverse form of the original image A and the image C are next operated upon. The inverse of the original image A is shown at D and defines the space region. The "mouse bite" portion of the image D is ANDed with image C to produce image E; in other words, the "mouse bite" has been reproduced. Now two contractions (inverse expansions) are applied to the resulting image E to form the images at F and G. The "mouse bite" does not cause an open break in the conductor image, as is specified.

In parallel with these operations, the image C is contracted to form the image shown at H. The inverse of image H is grown within the active area of the inverse of the original image A to form image I which now contains two "mouse bites" instead of a "mouse bite" and a void. Image I is contracted to form image J which is also not broken and thus satisfies the specification. By ANDing the original image A with the images G and J, image L is formed. Image L has no breaks in the conductor due to voids as contrasted to image Y. This technique is called void avoidance and is described by D. C. Forslund in "Void and Island False Call Limiter", IBM Technical Disclosure Bulletin, vol. 33, no. 5, October 1990, pp. 286–288.

Figure 16:
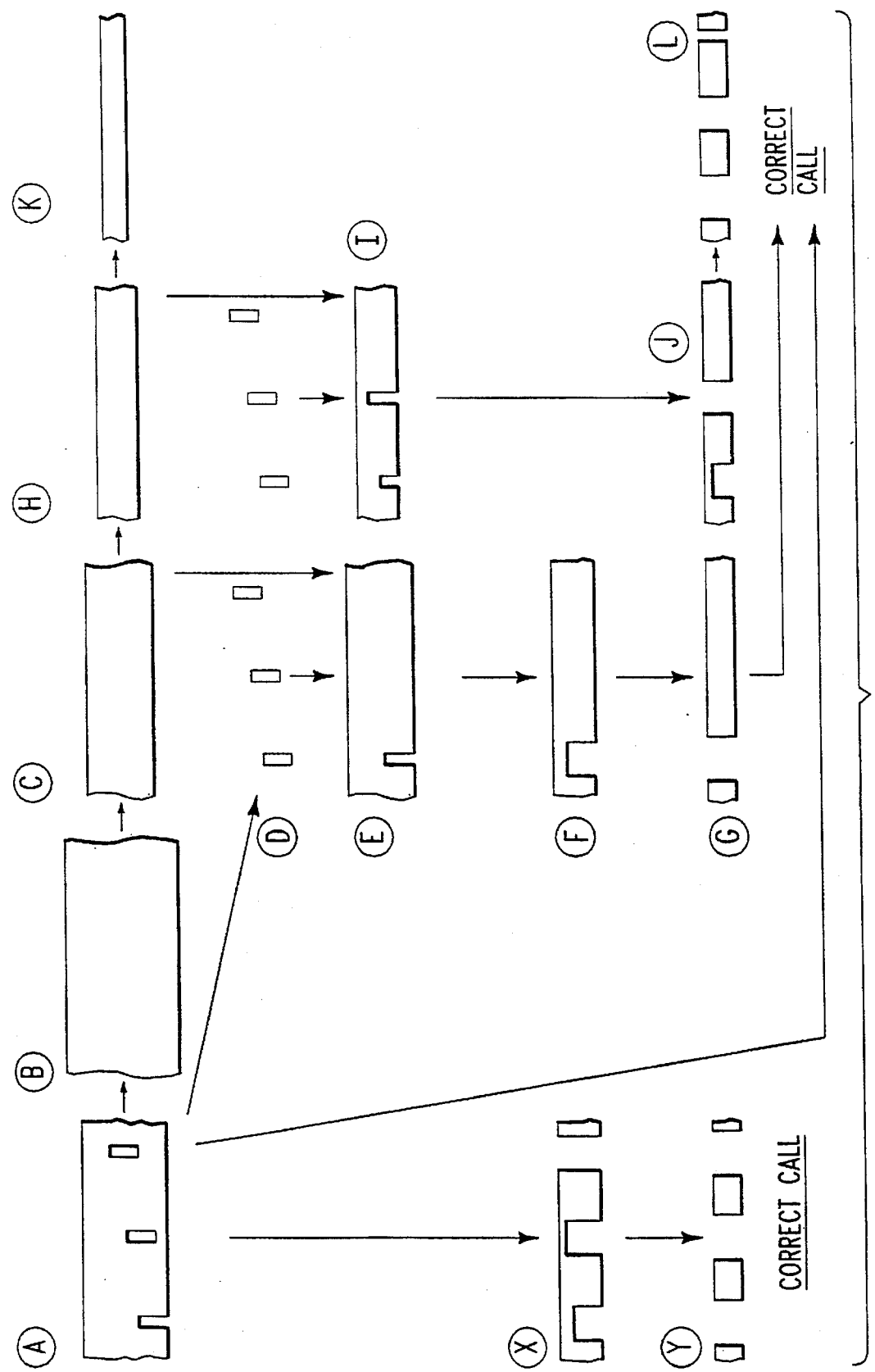
FIG. 16 illustrates a land pattern image and several morphological modifications resulting in an open defect being correctly detected.

FIG. 16 illustrates the same morphological scenario as FIG. 15 except with larger "mouse bite" and voids. Image C, the void-free image, is grown to form image E which is contracted twice to form the broken image shown at G. In parallel, image C is contracted to form image H which is grown to form the "mouse bites" in the image I. Image I is contracted once to form the broken image shown at J. ANDing the images A, G and J forms image L containing the three permissible breaks in the conductor, indicating three failures of specification.

FIGS. 17A to 17J show a sequence of images which render the large "mouse bite" and void defects of the upper land pattern but ignore the small "mouse bite" and voids of the lower land pattern. The images shown in FIGS. 17A and 17B are identical to those found in FIGS. 15 and 16. The opens rendition process is identical to the shorts renditions process except for the use of inverse images. A break in the land pattern established continuity between the two space regions on either side of the conductor. The images shown in FIG. 17C is formed from the inverse of the images shown in FIG. 17B together with the reference space skeleton. Shrinking of the images shown in FIG. 17C forms the successive images shown in FIGS. 17D, 17E and 17F.

The three thin vertical lines maintaining connectivity through the upper land pattern to the space skeletons is indicative of the large "mouse bite" and voids. There is no connectivity between the space skeletons of the lower line because the "mouse bite" and voids were small. The image shown in FIG. 17F is ANDed with the reference skeleton to form the defect centers (seeds) of the opens defect (dark pixels) in the images shown in FIG. 17G. The opens centers are grown within the confines of the image shown in FIG. 17F, and the inverse of the original images shown in FIG. 17A to form successive images shown in FIGS. 17H and 17I. By ANDing the images shown in FIG. 17I with the images shown in FIGS. 17A, the out-of-specification "mouse bite" and voids are rendered in the upper image shown in FIG. 17J.

Figure 18:
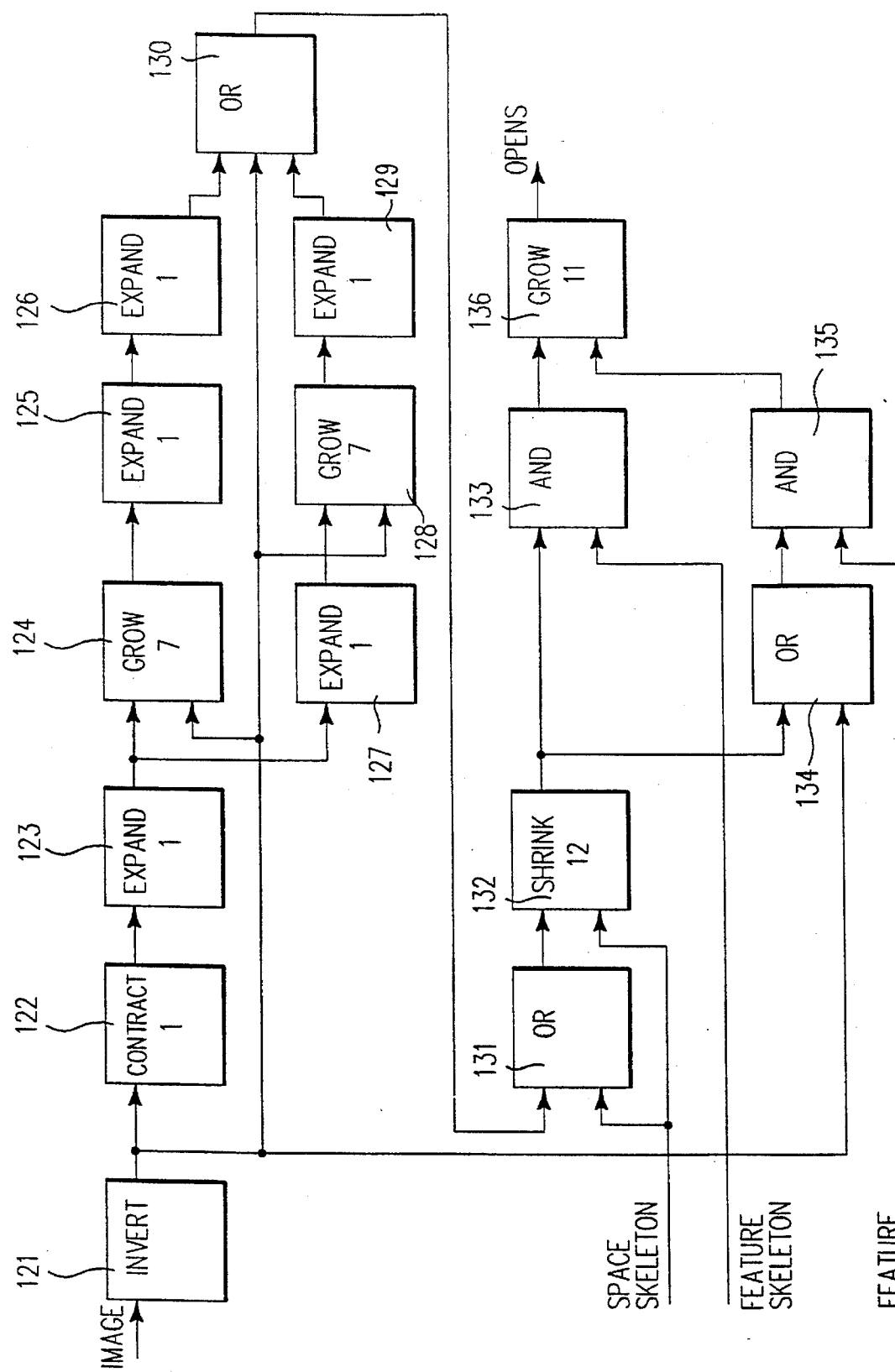
FIG. 18 is a block diagram of the opens defect detecting circuit according to a preferred embodiment of the invention.

The simple morphological block diagram of the above process is shown in FIG. 18. The original image A is inverted by inverters 121. The contraction and expansion operation by logic blocks 122 and 123, respectively, removes the "mouse bites" and voids. A parallel set of paths, comprising grow-expand-expand logic blocks 124, 125 and 126 and expand-grow-expand logic blocks 127, 128 and 129, provides the void avoidance operations. The outputs of the parallel paths and the original image are ORed (inverse image AND) in OR gates 130. The resulting image is further ORed in OR gates 131 with the space skeleton before shrinking the open breaks to a thin line in logic block 132. The open break thin lines are ANDed in AND gates 133 with the reference feature (land pattern) skeleton to form the center of the opens defect. The output of logic block 132 is also ORed with the inverse of the original image in OR gates 134, and the output of OR gates 134 are ANDed in AND gates 135 with the feature. The center represented by the outputs of AND gates 133 is grown in logic block 136 within the confines of the reference land pattern and the inverse of the original image together with the thin break lines as represented by the outputs of AND gates 135.

Figure 19:
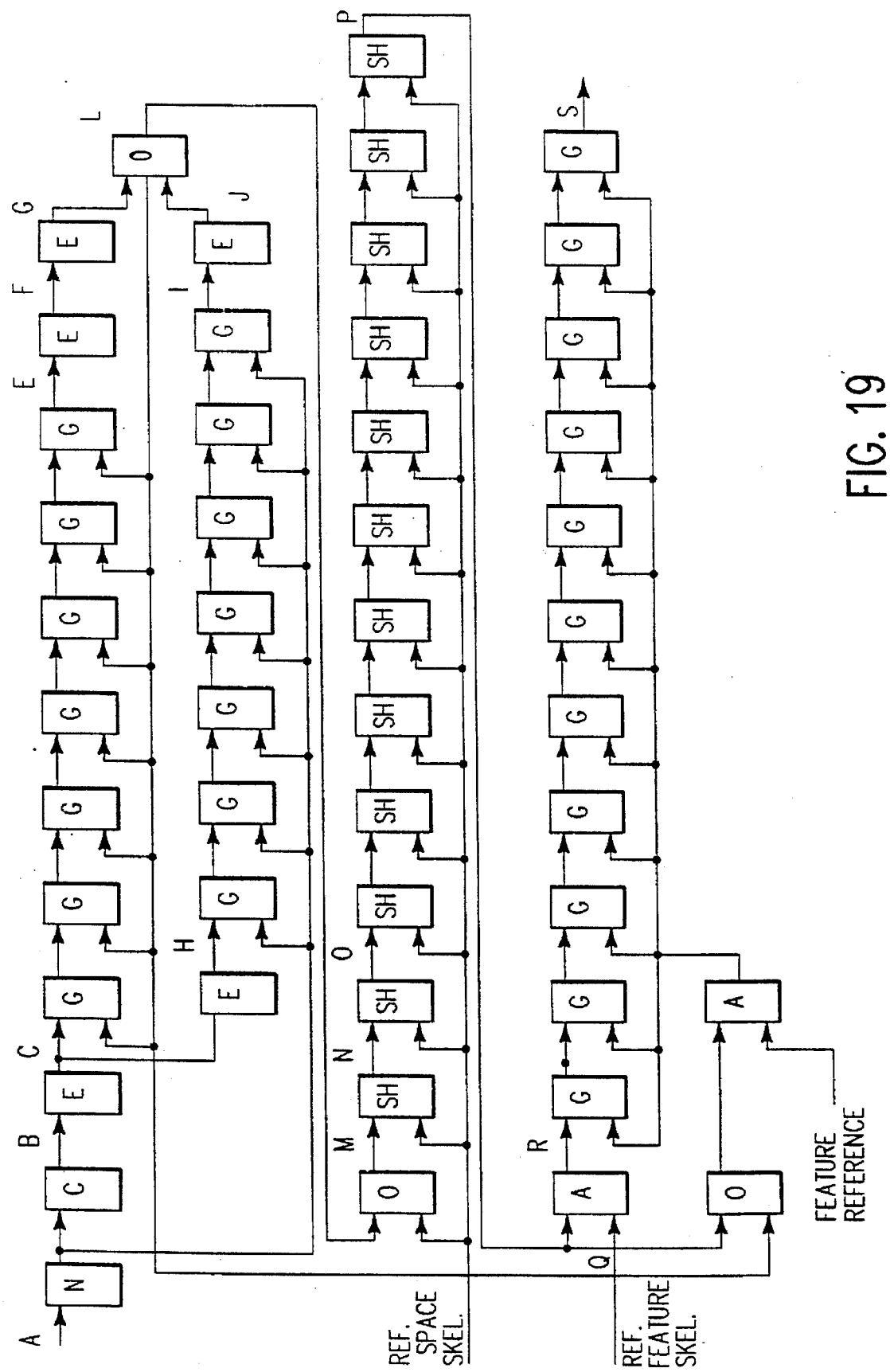
FIG. 19 is a block diagram showing in more detail the opens defect detecting circuit shown in FIG. 18.

FIG. 19 shows the morphological circuit of FIG. 18 in more detail, listing every stage of the process wherein C stands for contract, N stands for invert (i.e., not), E stands for expand, G stands for grow, SH stands for shrink, O stands for OR, and A stands for AND. The circled letters in FIG. 20 correspond to the sequences of images shown in FIGS. 15, 16 and 17. When employing the UIM, which performs four grows and two shrinks each, the circuit shown in FIG. 18 would require thirteen UIMs in the sixteen raster mode. More would be required if implemented in the pyramid mode.

Pad Voids Detection

Figure 20A:
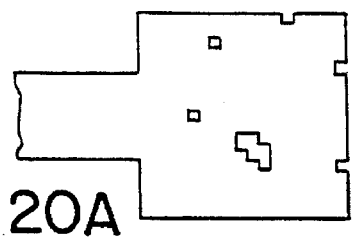
FIGS. 20A to 20G are a sequence of images wherein no void in a pad is correctly detected.
Figure 20B:
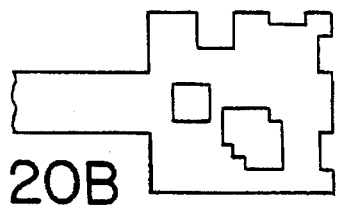
Figure 20C:
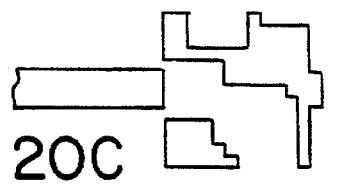
Figure 20D:
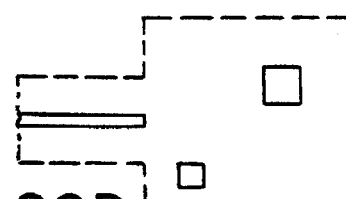
Figure 20E:
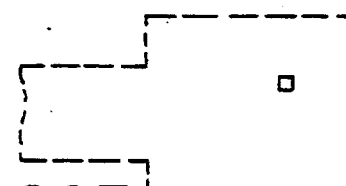
Figure 20F:
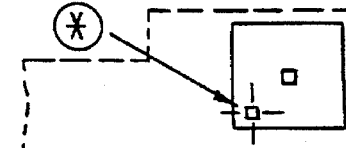
Figure 20G:
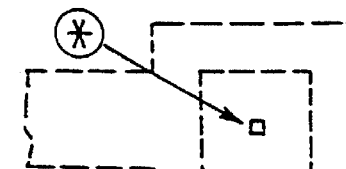

The bonding pad inspection requirement is met by the following morphological technique. FIGS. 20A to 20G show a no defect case, and FIGS. 21A to 21G show a defect case in detecting pad voids. In FIG. 20A, the image shows a pad with three voids and three "mouse bites". By contracting the image four times, successive images shown in FIGS. 20B, 20C, 20D, and 20E are formed. The image shown in FIG. 20E contains the remainder of a 9×9 pixel square area which meets the first specification. The second specification is that the area must reside within four pixels of the nominal (reference) pad center. By expanding the image shown in FIG. 20E four times, the area of the image shown in FIG. 20F must intersect the center of the reference pad shown by an asterisk ("*"). By inverting the image shown in FIG. 20F and ANDing it with the reference pad center, nothing is formed because the center is within the area. Expanding the image shown in FIG. 20F forms the image shown in FIG. 20G. Again, nothing is formed to indicate that no defect exists, and the pad area meets the second specification.

Figure 21A:
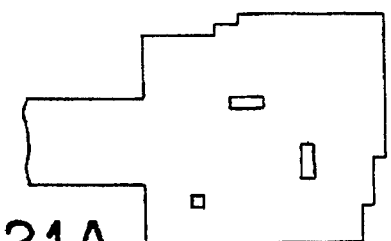
FIGS. 21A to 21G are a sequence of images which result in a void in a pad being correctly detected.
Figure 21B:
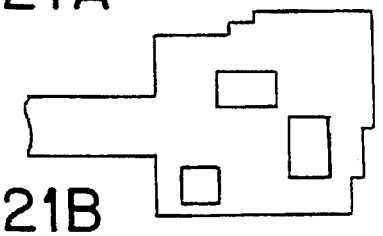
Figure 21C:
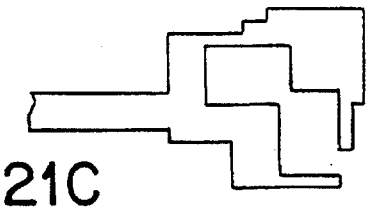
Figure 21D:
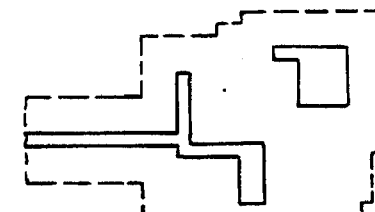
Figure 21E:
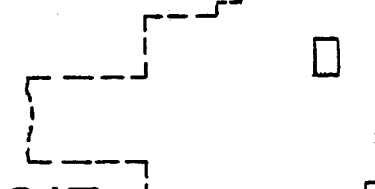
Figure 21F:
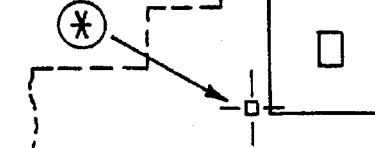
Figure 21G:
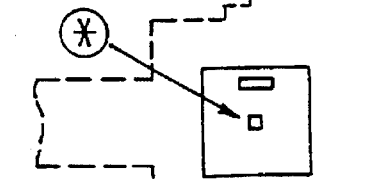

The image shown in FIG. 21A, on the other hand, shows a larger pad also with voids. By contracting the image shown in FIG. 21A four times, successive images shown in FIGS. 21B, 21C, 21D, and 21E are formed. The image shown in FIG. 21E contains a larger center of an area, which is indicative that this pad meets the first specification. That large center is expanded four times forming the image shown in FIG. 21F which does not contain the reference pad center. This is determined by inverting the image shown in FIG. 21F and ANDing it with the reference pad center as an indication that the second specification was not met. That reproduced center is then expanded four times to form an ideal pad area specification which is ANDed with the inverse of the original image shown in FIG. 21F to form the darkened defect in the image shown in FIG. 21G.

Not shown is the third case where no area of sufficient size can be found to meet the first specification. Four contractions would cause the image shown in FIG. 20E, for example, to be blank. The inverse of the image corresponding to FIG. 20E would be full, and the AND of the reference pad center would reproduce the pad center. That reproduced pad center would be expanded to the specified area and ANDed with the inverse of the original image, rendering voids in the desired area as defects.

Figure 22:
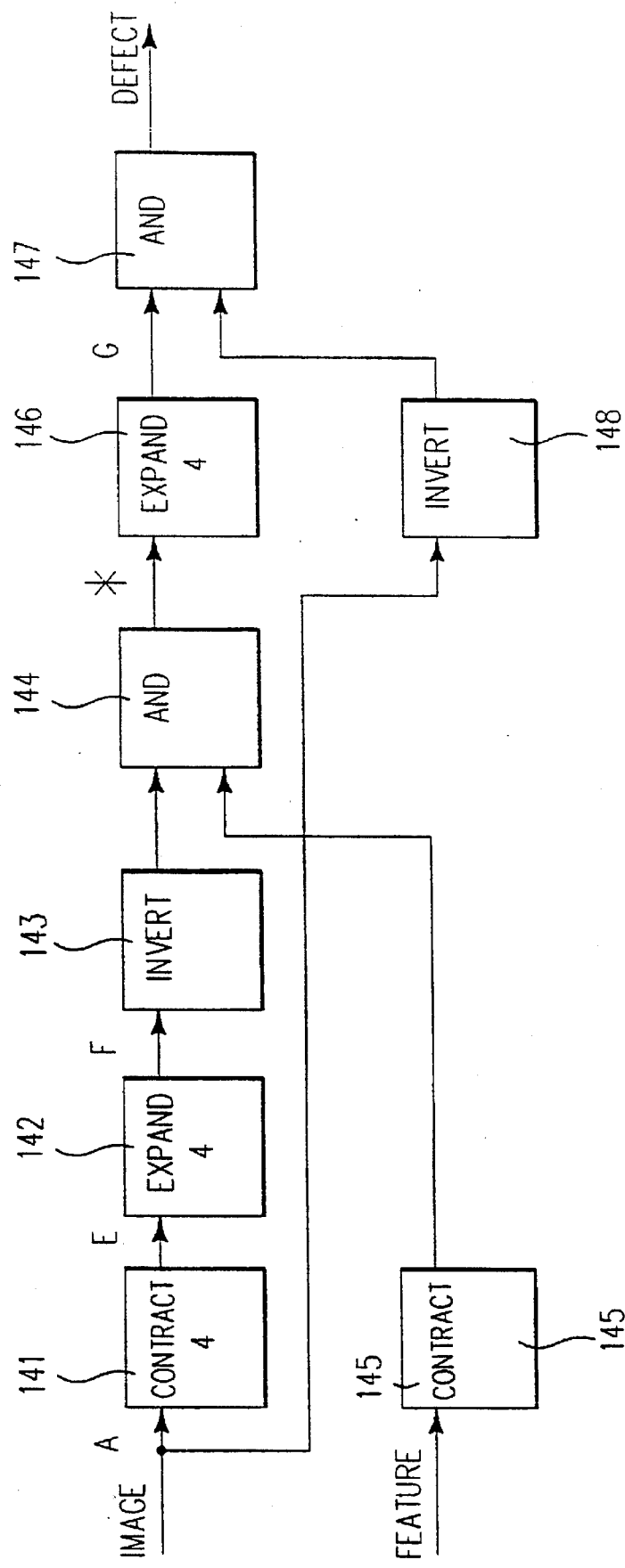
FIG. 22 is a block diagram of the pad void detection circuit according to a preferred embodiment of the invention.

The simple morphological circuit for this algorithm is shown in FIG. 22. This circuit is simpler than either the shorts or opens algorithm circuits shown in FIGS. 12 or 18, respectively. The number of stages are limited, mostly because the heavy use of shrink and grow functions are not necessary. Again, the circled letters in the circuit correspond to the images of FIGS. 20A to 20G and 21A to 21G, for the two cases illustrated by those figures. In FIG. 22, the original image is contracted four times by logic block 141 and then expanded four times by logic block 142. The resulting image (e.g., the image shown in FIGS. 20F or 21F) is inverted by inverters 143 and ANDed in AND gates 144 with the contracted feature from logic block 145. The resulting image is expanded four times by logic block 146 and ANDed in AND gates 147 with the inverted original image from inverters 148 to produce the defect image.

There are other possible pad void circuits which might render a selection of minimum size defects such that repair might be made easier. These algorithms would be applied in parallel to the one above. They would consist of limiting the initial contractions to three, two and one in addition to the circuits detailed above. If no defects were found in the four contraction algorithm, none would be found in the others. If a failure were found in the four contraction algorithm and the three contraction algorithm passes, the three contraction case image shown, for example, in FIG. 20F would be expanded once more and ANDed with the original to render the void. The same could be true for the two and one contraction algorithm. In this manner, it would be possible to render a smaller void as a defect to an area which is off the reference pad center.

Image Delay Compensation

Because the length of each of the defect detection morphological algorithms are different, the defects rendered from each channel are not in synchronism. Additional image delay must be added to each channel for compensation such that all channels have the same maximum delay.

When a new channel is added which exceeds the maximum delay, then all current channels must be additionally delayed. In addition to image delay, the channel position at the two scrolling stacks must be properly adjusted. For the channel outputs to be aligned, the channel pyramid base centers must be aligned.

Additional Channels

Although only three channels have been described, additional channels can be added to meet the additional inspection needs of a particular product part. When new and different product parts pose new defect specifications, additional channels can be added or current ones can be modified. An example of a new channel might be to ascertain connectivity of a large pad with a hidden central via. An example of a channel modification might be to render opens defects on different widths of land patterns.

Defect Image Selection

Figure 23:
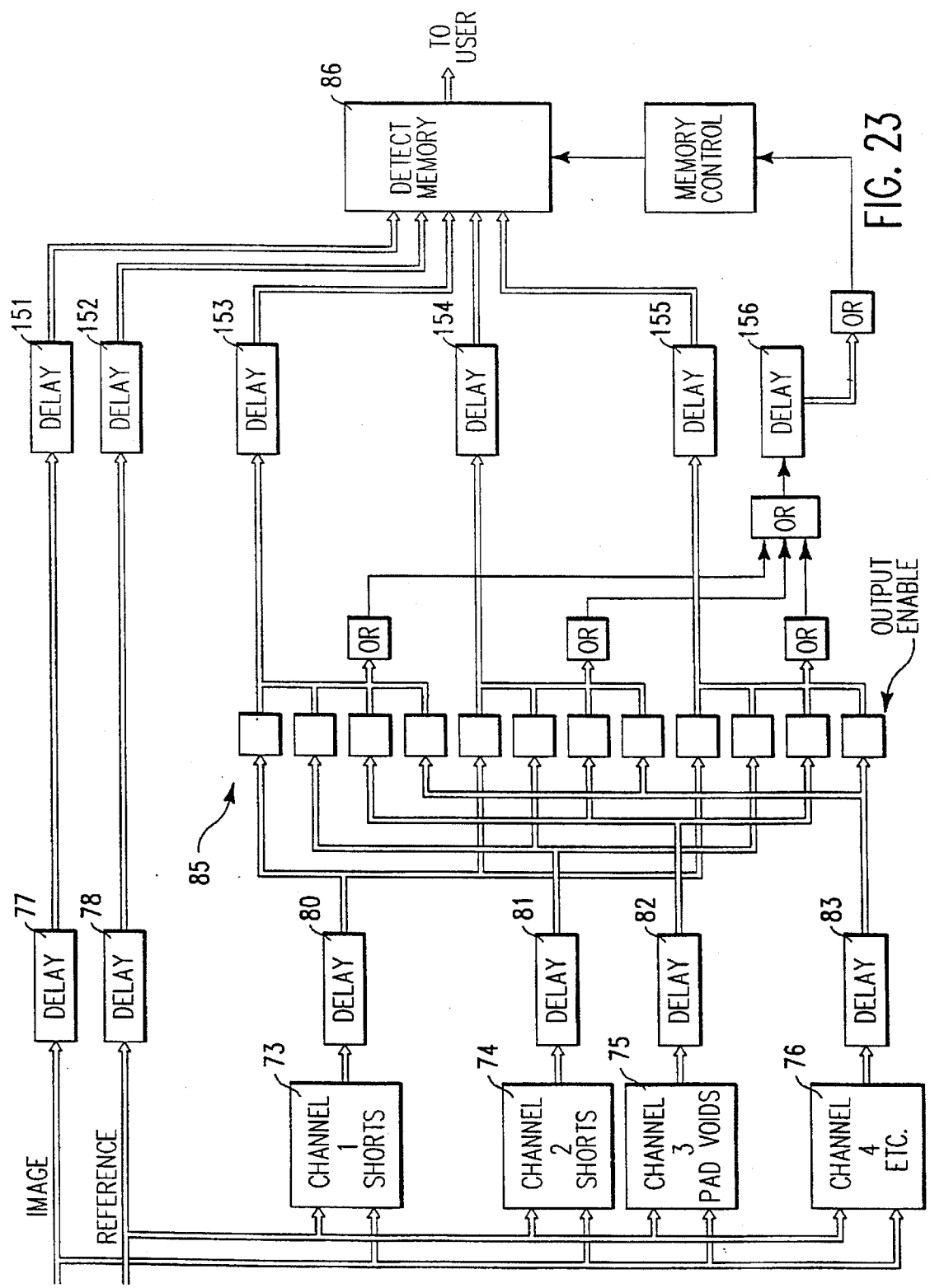
FIG. 23 is a block diagram of the defect selector circuit according to a preferred embodiment of the invention.

Because different products require different combinations of defect detection, only the output of those channels producing useful results must be selected. Also, a product might be inspected for only a subset of its specified defects. The crossbar switch 85 shown in FIG. 23 provides the selection. This crossbar switch simply uses output enabled parallel drivers to dot OR the selected defect channels into one of several memory input channels. The channel sixteen raster wide defect outputs feed the crossbar switch 85. Control lines select which channel outputs get ORed together into one (or more) of the three defect frame delays 153, 154, and 155. In this manner, shorts type defects can be collected together but kept separated from opens type and other miscellaneous defects.

Defect Memory

The frame delays 151 to 155 provide a buffer for the defect, the inspection and the reference images before they enter the defect memory 86. If there is a defect in any position of the crossbar switch output, that information is ORed into a similar length frame delay 156. If that delay frame contains an indication that a defect is present in the three defect delay frames, it causes the defect memory 86 to operate to accept the defect data. By that means, the defect memory 86 can be efficiently utilized, and defects can be properly framed and addressed.

Figure 24:
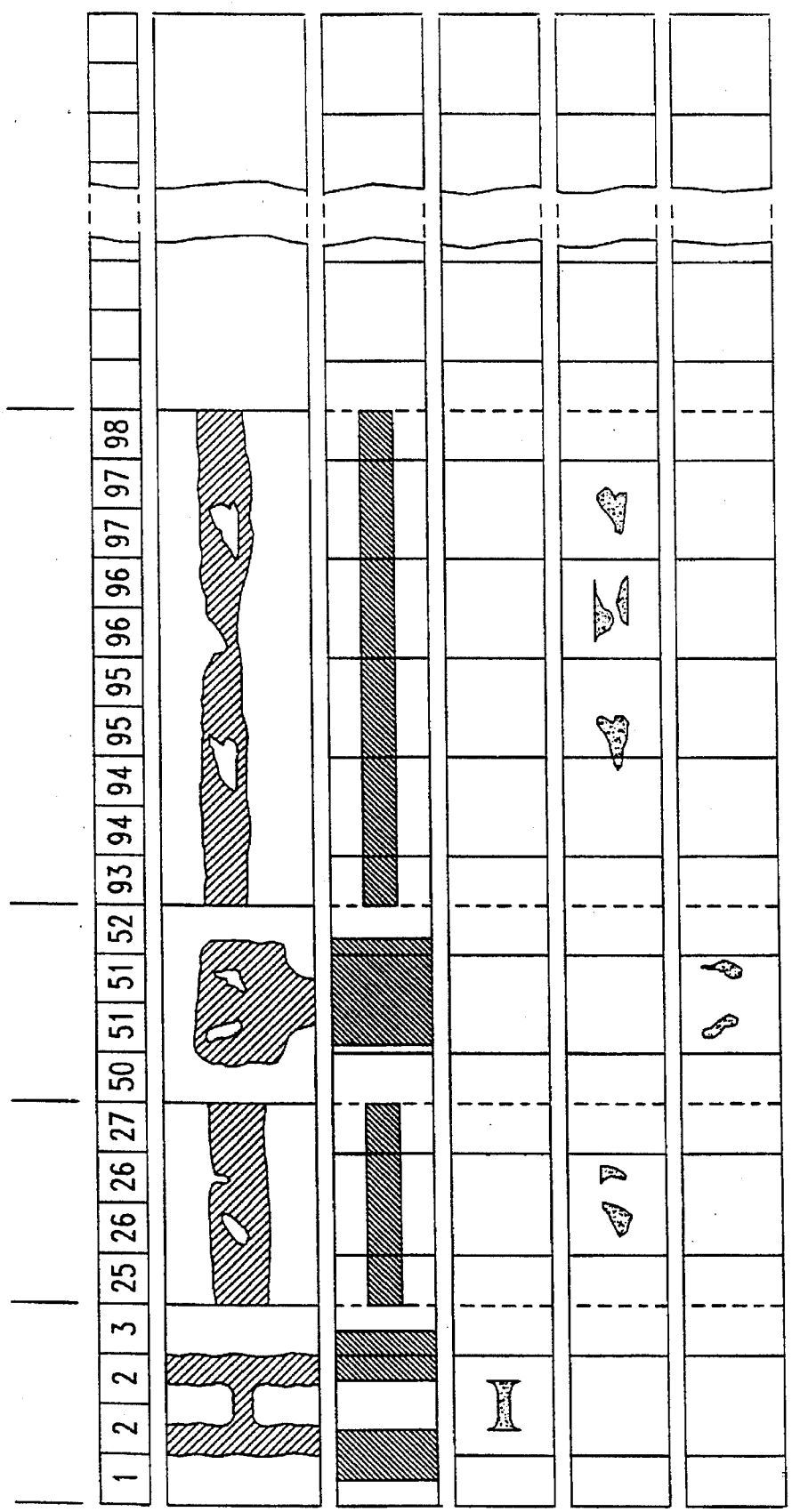
FIG. 24 illustrates defect memory formats.

FIG. 24 illustrates the contents of the defect memory 86. The system operates on sixteen raster advances. Although it is possible to operate on variable length raster segments, the preferred embodiment moves the rasters in sixteen pixel groups called frames. When a defect is found in one frame, the defect memory records not only that frame but also the half frame margins formed by the leading and trailing frames in order to provide the end user with overlapping information. Row 1 of the memory provides storage for the inspection image frame with a full (top, bottom and sides) half frame margin. This information is useful for automatic or manual fine alignment of the product part in a subsequent repair station. Row 2 provides a copy of the corresponding reference image for the repair station with left and right margins. Top and bottom margins could also be provided if desired. Rows 3, 4 and 5 in this example are programmed to record respectively shorts, opens and pad void defects.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A manufacturing inspection system for automatically inspecting a product for defects comprising:

database means for storing a parallel rasterized reference image of the product inspected at an inspection resolution;

imaging means for scanning the inspected product and generating plural parallel rasterized image data streams, each said image data stream comprising multiple parallel adjacent rasters;

means for accessing said database means including means for generating plural parallel rasterized reference data streams, each said reference data stream comprising multiple parallel adjacent rasters;

a plurality of parallel defect detection channels connected to receive the plural parallel rasterized reference data streams and the plural rasterized image data streams, each of said channels comprising plural raster circuit means for receiving said plural parallel rasterized image data streams and said plural parallel rasterized reference data streams and simultaneously, over a plurality of rasters, detecting a respective different type of defect in the inspected product by plural operations on combinations of ones of said plural parallel rasterized image data streams and said plural parallel rasterized reference data streams, in parallel, and producing an output representative thereof;

defect memory means for storing respective outputs of said plural parallel defect detection channels representing detected defects, wherein one of said plurality of parallel defect detection channels comprises a shorts detection channel, wherein said shorts detection channel comprises:

means responsive to a reference image data stream for generating a feature skeleton and a space skeleton of said reference image and space outputs corresponding to said reference image;

first logic means receiving the image data stream for expanding an image of said inspection data stream;

first ORing means for combining the expanded image from said first logic means with said feature skeleton;

second logic means receiving a combined output from said first ORing means and the feature skeleton for shrinking the combined image;

first ANDing means receiving as inputs the space skeleton and an output of said second logic means for forming the intersection of said inputs;

second ORing means receiving as inputs the image data stream and the output of said second logic means for combining the image of said image data stream with the image output of said second logic means;

second ANDing means receiving as inputs an output of said second ORing means and the space outputs for forming the intersection of said inputs;

third logic means receiving as inputs outputs of said first and second ANDing means for growing a resulting image; and third ANDing means receiving as inputs an output of said third logic means and said image data stream for providing as an output an inspection image of a detected defect.

2. A manufacturing inspection system for automatically inspecting a product for defects comprising:

database means for storing a parallel rasterized reference image of the product inspected at an inspection resolution;

imaging means for scanning the inspected product and generating plural parallel rasterized image data streams, each said image data stream comprising multiple parallel adjacent rasters;

means for accessing said database means including means for generating plural parallel rasterized reference data streams, each said reference data stream comprising multiple parallel adjacent rasters;

a plurality of parallel defect detection channels connected to receive the plural parallel rasterized reference data streams and the plural rasterized image data streams, each of said channels comprising plural raster circuit means for receiving said plural parallel rasterized image data streams and said plural parallel rasterized reference data streams and simultaneously, over a plurality of rasters, detecting a respective different type of defect in the inspected product by plural operations on combinations of ones of said plural parallel rasterized image data streams and said plural parallel rasterized reference data streams, in parallel, and producing an output representative thereof;

defect memory means for storing respective outputs of said plural parallel defect detection channels representing detected defects, wherein one of said plurality of parallel defect detection channels comprises an opens detection channel, wherein said opens detection channel comprises:

means responsive to a reference image data stream for generating a feature skeleton and a space skeleton of said reference image and feature output corresponding to said reference image;

inverting means for inverting an original image of said image data stream;

first logic means receiving the inverted original image for contraction and expanding the inverted original image;

second and third logic means connected in parallel and receiving an output of said first logic means for respectively performing grow-expand-expand and expand-grow-expand functions;

first ORing means for combining outputs of said second and third logic means with the inverted original image;

second ORing means for combining an output of said first ORing means with the space skeleton;

fourth logic means receiving an output of said second ORing means and said space skeleton for shrinking a resulting image;

first ANDing means receiving as inputs an output of said fourth logic means and the feature skeleton for forming a center of an opens defect;

third ORing means for combining an output of said fourth logic means with the inverse of the original image;

second ANDing means receiving as inputs an output of said third ORing means and the feature output; and fifth logic means receiving as inputs outputs of said first and second ANDing means for growing a center represented by the output of said first ANDing means within confines of a reference land pattern and the inverse of the original image together with thin break lines as represented by outputs of said second ANDing means.

3. A manufacturing inspection system for automatically inspecting a product for defects comprising:

database means for storing a parallel rasterized reference image of the product inspected at an inspection resolution;

imaging means for scanning the inspected product and generating plural parallel rasterized image data streams, each said image data stream comprising multiple parallel adjacent rasters;

means for accessing said database means including means for generating plural parallel rasterized reference data streams, each said reference data stream comprising multiple parallel adjacent rasters;

a plurality of parallel defect detection channels connected to receive the plural parallel rasterized reference data streams and the plural rasterized image data streams, each of said channels comprising plural raster circuit means for receiving said plural parallel rasterized image data streams and said plural parallel rasterized reference data streams and simultaneously, over a plurality of rasters, detecting a respective different type of defect in the inspected product by plural operations on combinations of ones of said plural parallel rasterized image data streams and said plural parallel rasterized reference data streams, in parallel, and producing an output representative thereof;

defect memory means for storing respective outputs of said plural parallel defect detection channels representing detected defects, wherein one of said plurality of parallel defect detection channels comprises a voids detection channel, wherein said voids detection channel comprises:

first logic means receiving the image data stream for contracting an original image of said image data stream;

second logic means receiving the contracted original image from said first logic means for expanding the contracted image;

first inverting means for inverting a resulting image from said second logic means;

third logic means receiving a feature output and contracting said feature output;

first ANDing means receiving as inputs the inverted resulting image from said first inverting means and the contracted feature output from said third logic means and forming an intersection of said inputs;

fourth logic means receiving an output of said first ANDing means for expanding a resulting image;

second inverting means for inverting an original image of said inspection data stream; and second ANDing means receiving as inputs an output of said fourth logic means and the inverted original image from said second inverting means for producing a defect image.

4. A manufacturing inspection system for automatically inspecting a product for defects comprising:

database means for storing a parallel rasterized reference image of the product inspected at an inspection resolution;

imaging means for scanning the inspected product and generating plural parallel rasterized image data streams, each said image data stream comprising multiple parallel adjacent rasters;

means for accessing said database means including means for generating plural parallel rasterized reference data streams, each said reference data stream comprising multiple parallel adjacent rasters;

a plurality of parallel defect detection channels connected to receive the plural parallel rasterized reference data streams and the plural rasterized image data streams, each of said channels comprising plural raster circuit means for receiving said plural parallel rasterized image data streams and said plural parallel rasterized reference data streams and simultaneously, over a plurality of rasters, detecting a respective different type of defect in the inspected product by plural operations on combinations of ones of said plural parallel rasterized image data streams and said plural parallel rasterized reference data streams, in parallel, and producing an output representative thereof;

defect memory means for storing respective outputs of said plural parallel defect detection channels representing detected defects, wherein one of said plurality of parallel defect detection channels comprises a shorts detection channel, an opens detection channel and a voids detection channel, said manufacturing inspection system further comprising means responsive to a reference image data stream for generating a feature skeleton and a space skeleton of said reference image and space and feature outputs corresponding to said reference image, and wherein said shorts detection channel comprises:

first logic means receiving the image data stream for expanding an image of said image data stream;

first ORing means for combining the expanded image from said first logic means with said feature skeleton;

second logic means receiving a combined output from said first ORing means and the feature skeleton for shrinking the combined image;

first ANDing means receiving as inputs the space skeleton and an output of said second logic means for forming the intersection of said inputs;

second ORing means receiving as inputs the image data stream and the output of said second logic means for combining the image of said image data stream with the image output of said second logic means;

second ANDing means receiving as inputs an output of said second ORing means and the space outputs for forming the intersection of said inputs;

third logic means receiving as inputs outputs of said first and second ANDing means for growing a resulting image; and third ANDing means receiving as inputs an output of said third logic means and said image data stream for providing as an output an inspection image of a detected defect;

and wherein said opens detection channel comprises:

first inverting means for inverting an original image of said image data stream;

fourth logic means receiving the inverted original image for contraction and expanding the inverted original image;

fifth and sixth logic means connected in parallel and receiving an output of said fourth logic means for respectively performing grow-expand-expand and expand-grow-expand functions;

third ORing means for combining outputs of said fifth and sixth logic means with the inverted original image;

fourth ORing means for combining an output of said third ORing means with the space skeleton;

seventh logic means receiving an output of said fourth ORing means and said space skeleton for shrinking a resulting image;

fourth ANDing means receiving as inputs an output of said seventh logic means and the feature skeleton for forming a center of an opens defect;

fifth ORing means for combining an output of said seventh logic means with the inverse of the original image;

fifth ANDing means receiving as inputs an output of said fifth ORing means and the feature output; and eighth logic means receiving as inputs outputs of said fourth and fifth ANDing means for growing a center represented by the output of said fourth ANDing means within confines of a reference land pattern and the inverse of the original image together with thin break lines as represented by outputs of said fifth ANDing means;

and wherein said voids detection channel comprises:

ninth logic means receiving the image data stream for contracting the original image;

tenth logic means receiving the contracted original image from said ninth logic means for expanding the contracted image;

second inverting means for inverting a resulting image from said tenth logic means;

eleventh logic means receiving the feature output and contracting said feature output;

sixth ANDing means receiving as inputs the inverted resulting image from said second inverting means and the contracted feature output from said eleventh logic means and forming an intersection of said inputs;

twelfth logic means receiving an output of said sixth ANDing means for expanding a resulting image;

third inverting means for inverting an original image of said image data stream; and seventh ANDing means receiving as inputs an output of said twelfth logic means and the inverted original image from said third inverting means for producing a defect.

* * * * *

UNITED STATES PATENT AND TRADEMARK OFFICE
CERTIFICATE OF CORRECTION

PATENT NO. : 5,659,630
DATED : August 19, 1997
INVENTOR(S) : Donald C. Forslund

It is certified that error appears in the above-identified patent and that said Letters Patent is hereby corrected as shown below:

On the title page, item [56], under Attorney, Agent, or Firm, please delete "Tiffany L. Townsend".

Signed and Sealed this

Third Day of March, 1998

Attest:

BRUCE LEHMAN

Attesting Officer

Commissioner of Patents and Trademarks